US012015001B2

(12) United States Patent
Tai et al.

(10) Patent No.: US 12,015,001 B2
(45) Date of Patent: Jun. 18, 2024

(54) BONDING STRUCTURE AND METHOD THEREOF

(71) Applicant: TAIWAN SEMICONDUCTOR MANUFACTURING COMPANY LTD., Hsinchu (TW)

(72) Inventors: Wen-Chuan Tai, Hsinchu (TW); Fan Hu, Taipei (TW); Hsiang-Fu Chen, Hsinchu County (TW); Li-Chun Peng, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/695,815

(22) Filed: Mar. 15, 2022

(65) Prior Publication Data

US 2023/0299028 A1 Sep. 21, 2023

(51) Int. Cl.
*H01L 23/00* (2006.01)
*H01L 21/50* (2006.01)
*H01L 23/10* (2006.01)

(52) U.S. Cl.
CPC .............. *H01L 24/08* (2013.01); *H01L 21/50* (2013.01); *H01L 23/10* (2013.01); *H01L 24/09* (2013.01); *H01L 24/80* (2013.01); *H01L 2224/0801* (2013.01); *H01L 2224/08053* (2013.01); *H01L 2224/08059* (2013.01); *H01L 2224/08221* (2013.01); *H01L 2224/0903* (2013.01); *H01L 2224/09055* (2013.01); *H01L 2224/80203* (2013.01); *H01L 2224/80805* (2013.01); *H01L 2224/8083* (2013.01);

(Continued)

(58) Field of Classification Search
CPC .............. H01L 23/10; H01L 24/28–30; H01L 2224/08059; H01L 2224/03011; H01L 2224/05011; H01L 2224/05017; H01L 2924/16235; H01L 2924/16251; H01L 2924/163; H01L 2924/161; H01L 21/50
See application file for complete search history.

(56) References Cited

U.S. PATENT DOCUMENTS 5,929,521 A * 7/1999 Wark ................. H01L 23/49811
257/E21.511
6,179,198 B1 * 1/2001 Eifuku ................. B23K 1/0016
228/103

(Continued)

FOREIGN PATENT DOCUMENTS

JP 201098098 * 4/2010
JP 2010098098 A * 4/2010 .............. H01L 24/11

*Primary Examiner* — David A Zarneke
(74) *Attorney, Agent, or Firm* — WPAT LAW; Anthony King

(57) ABSTRACT

A bonding method and a bonding structure are provided. A device substrate is provided including a plurality of semiconductor devices, wherein each of the semiconductor devices includes a first bonding layer. A cap substrate is provided including a plurality of cap structures, wherein each of the cap structures includes a second bonding layer, the second bonding layer having a planar surface and a first protrusion protruding from the planar surface. The device substrate is bonded to the cap substrate by engaging the first protrusion of the second bonding layer of each of the cap structures with the corresponding first bonding layer of each of the semiconductor devices in the device substrate.

20 Claims, 32 Drawing Sheets

(52) U.S. Cl.
CPC .............. *H01L 2224/80895* (2013.01); *H01L 2924/1611* (2013.01); *H01L 2924/1616* (2013.01); *H01L 2924/16235* (2013.01); *H01L 2924/1631* (2013.01); *H01L 2924/16315* (2013.01); *H01L 2924/1632* (2013.01)

(56) References Cited

U.S. PATENT DOCUMENTS

| | | | | |
|---|---|---|---|---|
| 6,543,674 | B2* | 4/2003 | Lee | H01L 24/16 |
| | | | | 257/E21.511 |
| 6,897,570 | B2* | 5/2005 | Nakajima | H01L 23/5226 |
| | | | | 257/784 |
| 7,932,601 | B2* | 4/2011 | Chang | H01L 24/13 |
| | | | | 257/738 |
| 7,969,004 | B2* | 6/2011 | Ohnishi | H01L 24/11 |
| | | | | 257/737 |
| 8,247,890 | B2* | 8/2012 | Oda | H01L 21/6835 |
| | | | | 257/E23.056 |
| 8,928,141 | B2* | 1/2015 | Souriau | H01L 24/13 |
| | | | | 257/737 |
| 9,214,410 | B2* | 12/2015 | Kim | H01L 25/50 |
| 9,567,212 | B2* | 2/2017 | Gonska | B81B 7/02 |
| 10,157,874 | B2* | 12/2018 | Tsai | H05K 1/111 |
| 10,163,840 | B2* | 12/2018 | Lee | H01L 24/81 |
| 2006/0055034 | A1* | 3/2006 | Wark | H01L 23/49816 |
| | | | | 257/E21.511 |
| 2020/0006273 | A1* | 1/2020 | Dubey | H01L 24/17 |
| 2021/0408330 | A1* | 12/2021 | Yuan | H01L 33/62 |

* cited by examiner

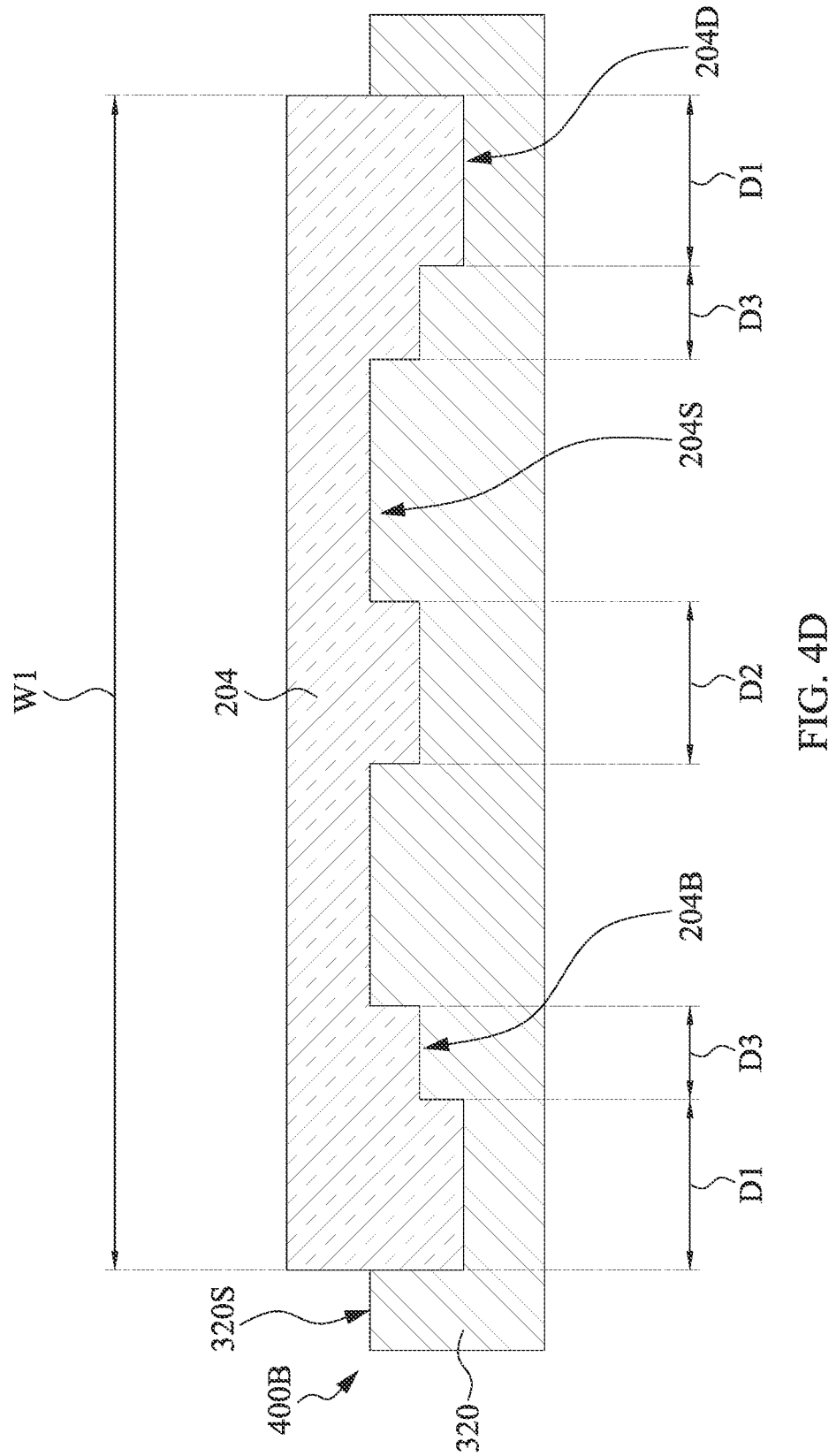

BONDING STRUCTURE AND METHOD THEREOF

BACKGROUND

Electronic equipment involving semiconductive devices is essential for many modern applications. Technological advances in materials and design have produced generations of semiconductive devices where each generation incorporates smaller and more complex circuits than the previous generation. In the course of advancement and innovation, the formation of semiconductor devices usually involves bonding of two or more layers. Among the various bonding techniques, eutectic bonding is widely employed for its advantages of reduced bonding areas and good bonding performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4B to 4D are cross-sectional views of different bonding stages of forming a semiconductor device, in accordance with some embodiments.

DETAILED DESCRIPTION

Figure 1A:
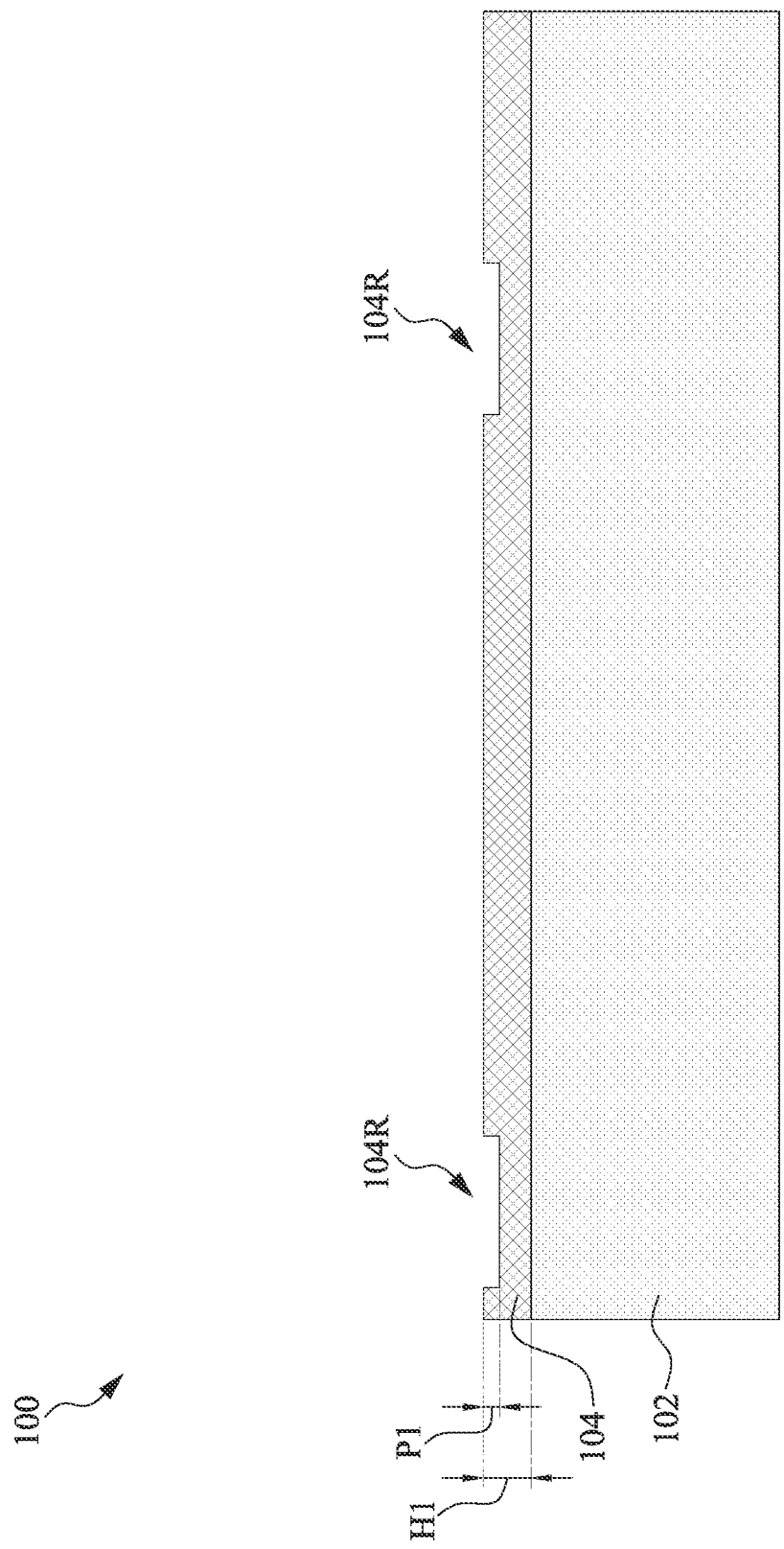
FIG. 1A to FIG. 1G are cross-sectional views of intermediate stages of a method of manufacturing a cap structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The terms "couple," "coupled" and "coupling" used throughout the present disclosure describe the direct or indirect connections between two or more devices or elements. In some cases, a coupling between at least two devices or elements refers to mere electrical or conductive connections between them and intervening features may be present between the coupled devices and elements. In some other cases, a coupling between at least two devices or elements may involve physical contact and/or electrical connections.

The present disclosure relates generally to a bonding method and a bonding structure, and relates specifically to a method and a structure for eutectic bonding. Eutectic bonding is widely applied to various semiconductor devices, such as 3D integrated chip (3DIC), semiconductor packages, micro-electro mechanical system (MEMS) devices, and the like. A eutectic alloy is formed at the interface of two bonding layers to thereby mechanically or electrically join the two bonding layers. The present disclosure discusses embodiments of a new bonding scheme for a semiconductor device, wherein the resultant bonding layer includes one or more protrusions, which can provide better bonding performance with respect to a sealed cavity in the semiconductor device. As a result, the durability or lifespan of the semiconductor device can be improved.

FIG. 1A to FIG. 1G are cross-sectional views of intermediate stages of a method of manufacturing a cap structure 100, in accordance with some embodiments.

Referring to FIG. 1A, a substrate 102 is provided or received. In some embodiments, the substrate 102 is provided in a form of a wafer, and includes a bulk material, such as silicon. In some other embodiments, the substrate 102 is formed of other materials, such as glass, ceramic. The substrate 102 may not include any active components, such as a transistor or a diode, or any passive components, such as, a capacitor, an inductor, a resistor, or the like.

In an embodiment, a material layer 104L is deposited over the substrate 102. The material layer 104L may include suitable materials for eutectic bonding, such as germanium, aluminum, aluminum copper, gold, silver, indium, tin, alloys thereof, or the like. In the depicted embodiment, the material layer 104L is formed of germanium. The material layer 104L is deposited over the substrate 102 by chemical vapor deposition (CVD), physical vapor deposition (PVD), atomic layer deposition (ALD), or other suitable deposition methods. The material layer 104L may be deposited to a height H1 in a range between about 0.5 μm and about 5 μm, e.g., 1 μm. The material layer 104L is further patterned to form recesses 104R on an upper surface of the material layer 104L. The patterning operation may be performed using a lithography process and an etching process. As an example patterning operation, a patterned mask or photoresist layer (not separately shown) is formed over the material layer 104L. The material layer 104L is then etched to form the recesses 104R with the patterned mask or photoresist layer serving as an etch mask, wherein the etch may be performed using a dry etch, a wet etch, a combination thereof, or the like. The patterned mask or photoresist layer may be stripped or removed using wet etching or plasma etching. Through the patterning operation on the material layer 104L, the as-formed recess 104R has a depth P1 in a range between about 500 angstrom and about 5000 angstrom, e.g., 1000 angstrom. In some embodiments, a ratio between the depth P1 and the height H1 is between about 1% and about 50%, e.g., 10%. In the present embodiment, the recess 104R includes a ring shape, a polygonal shape or a circular shape on the material layer 104L from a top-view perspective.

Figure 1B:
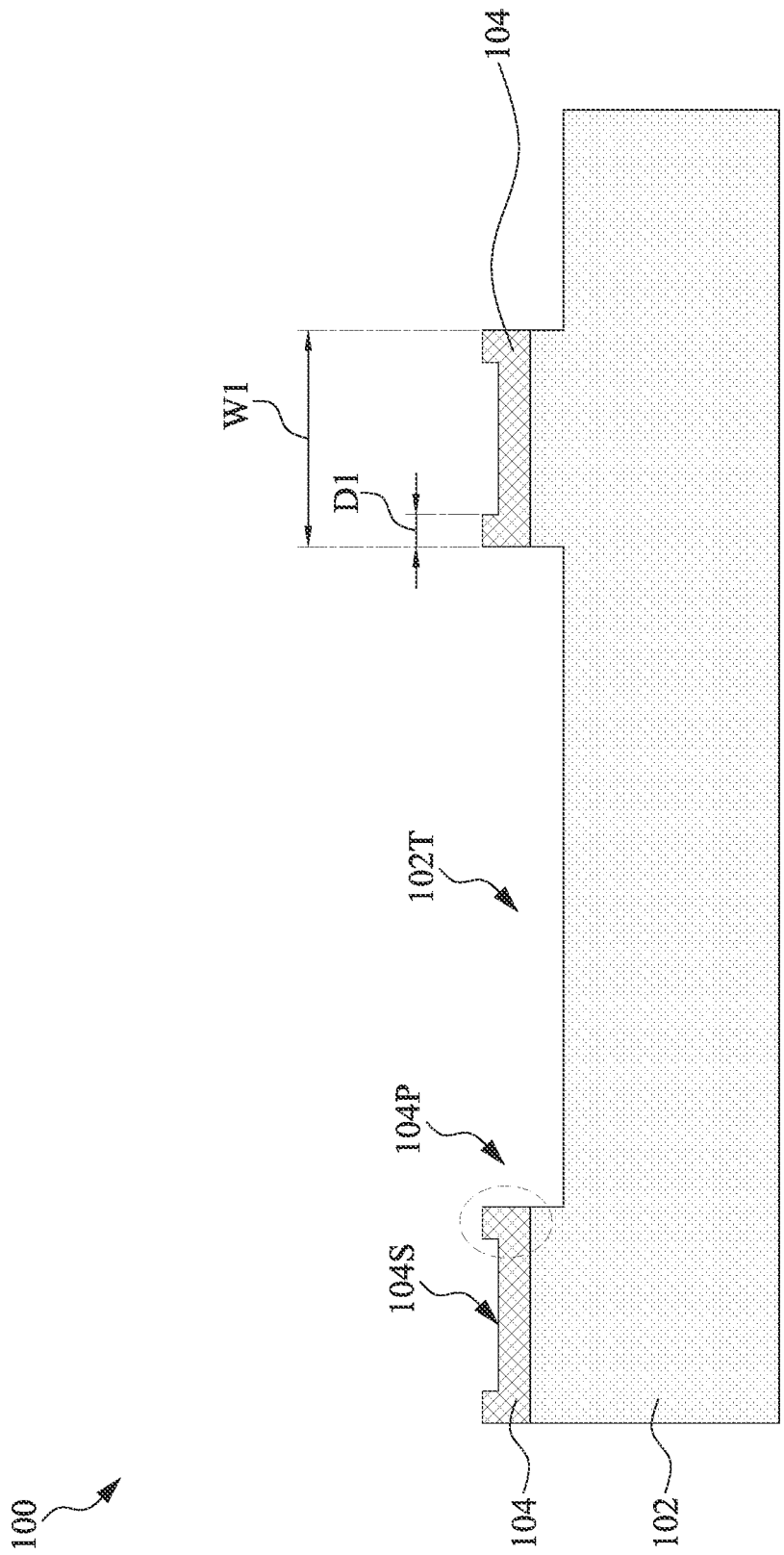

Referring to FIG. 1B, another patterning operation is adopted to pattern the material layer 104L and the substrate 102 to thereby form a bonding layer 104 over the substrate 102. In an embodiment, the patterning operation of FIG. 1B defines a ring shape, a polygonal shape or a circular shape, and includes the recesses 104R. As an example patterning operation, a first etch operation is applied to the material layer 104L to form the bonding layer 104. The first etch operation may be performed using a dry etch, a wet etch, a combination thereof, or the like. A second etch operation is performed on the substrate 102 using the patterned bonding layer 104 as an etch mask, forming a recessed region (or trench) 102T in the substrate 102. In some embodiments, the bonding layer 104 and trench 102T are formed during a single etching operation. In some embodiments, the depth of the trench 102T is determined according to a specification of a cavity of a semiconductor device, e.g., a gap between a stopper structure and a movable membrane of an MEMS device.

Figure 1C:
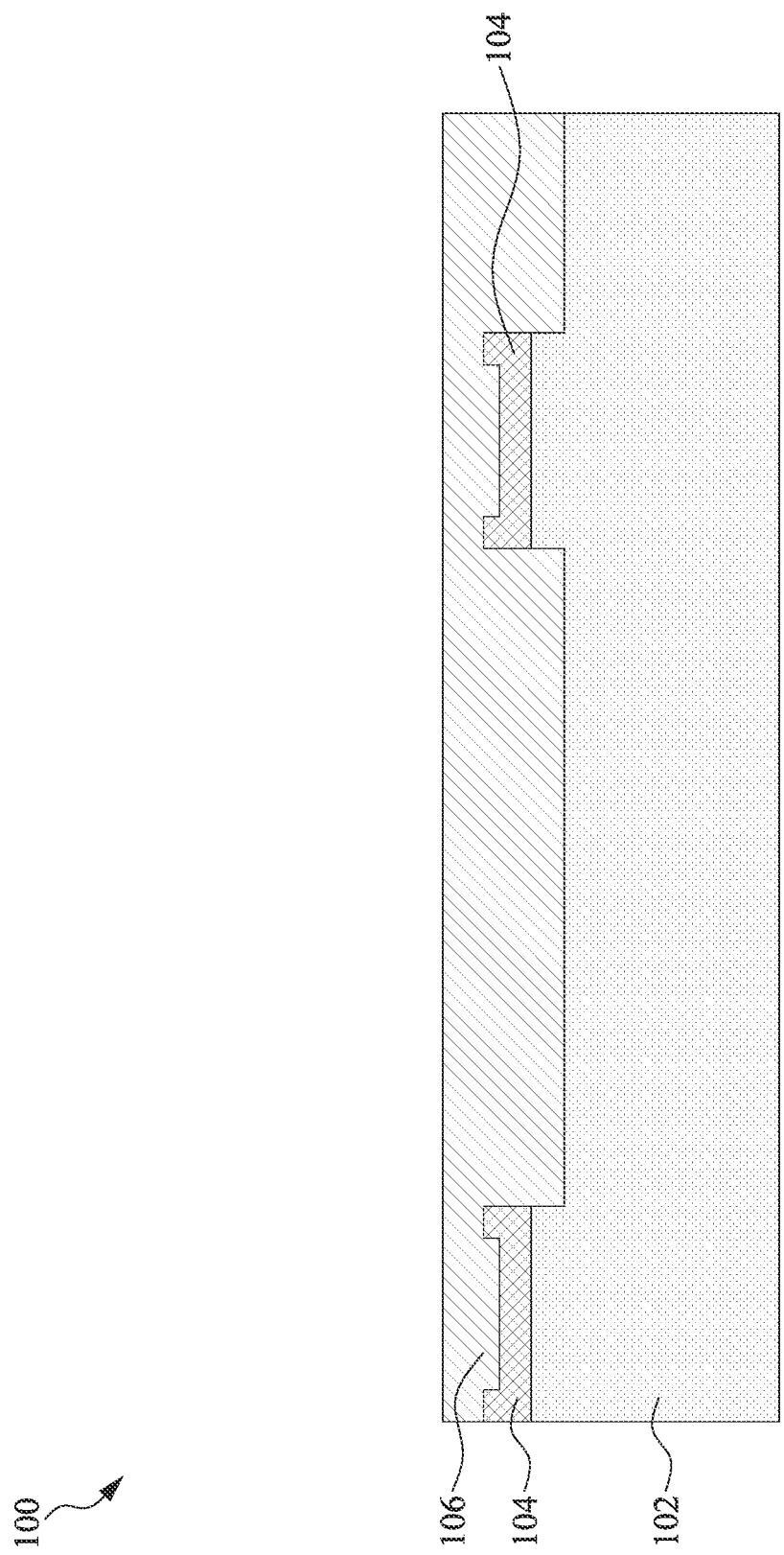
Figure 1D:
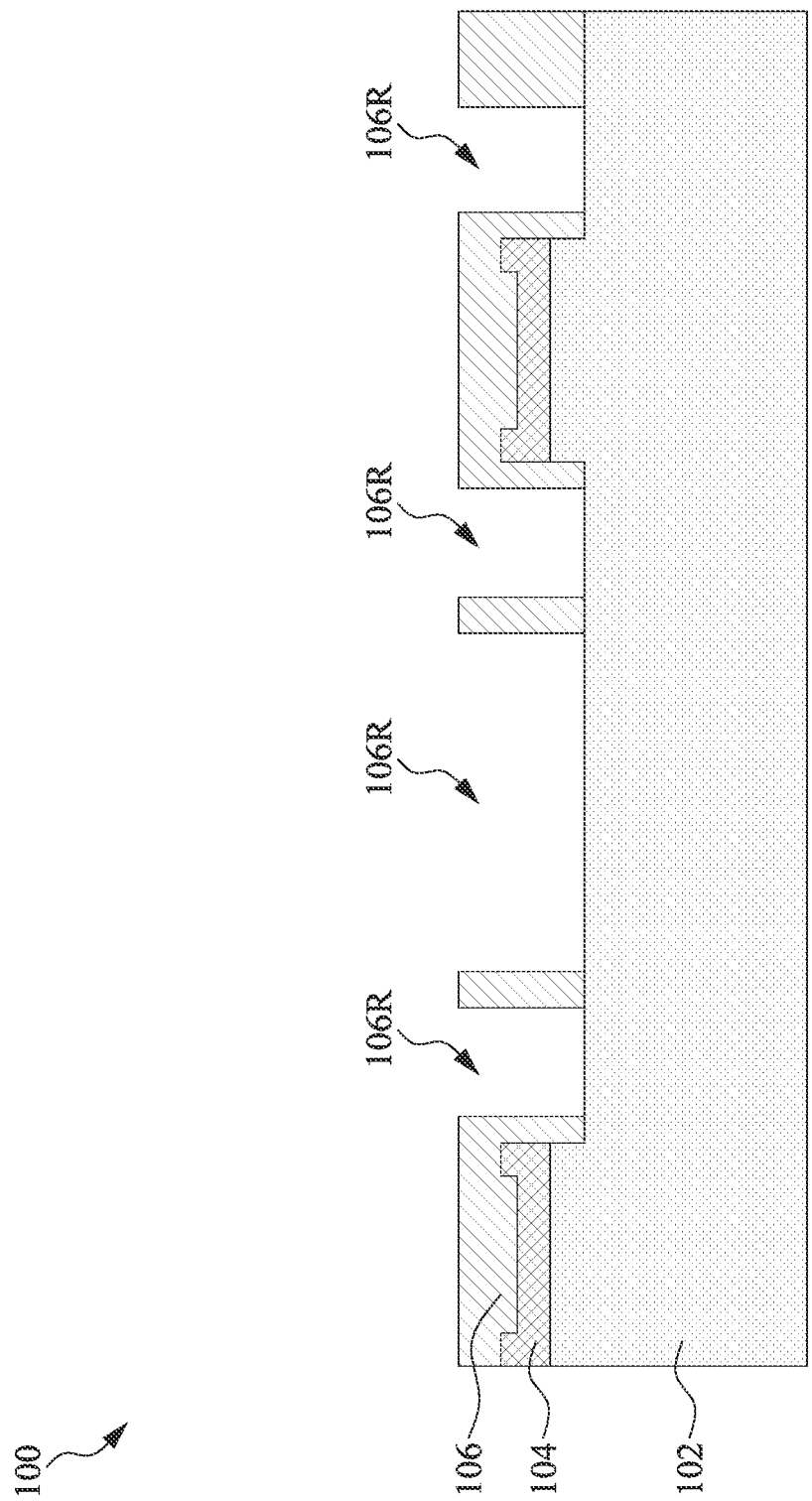
Figure 1E:
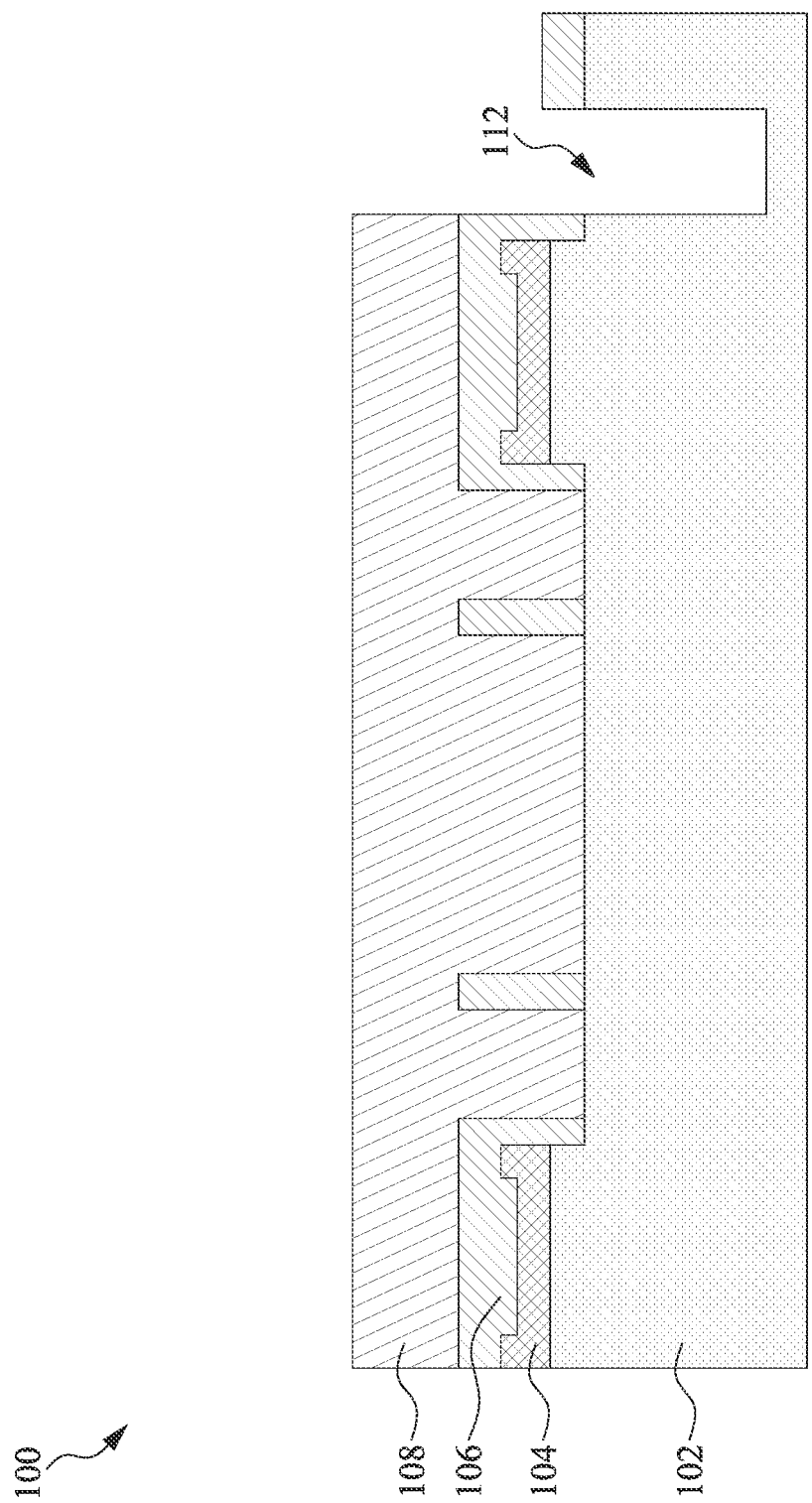
Figure 1F:
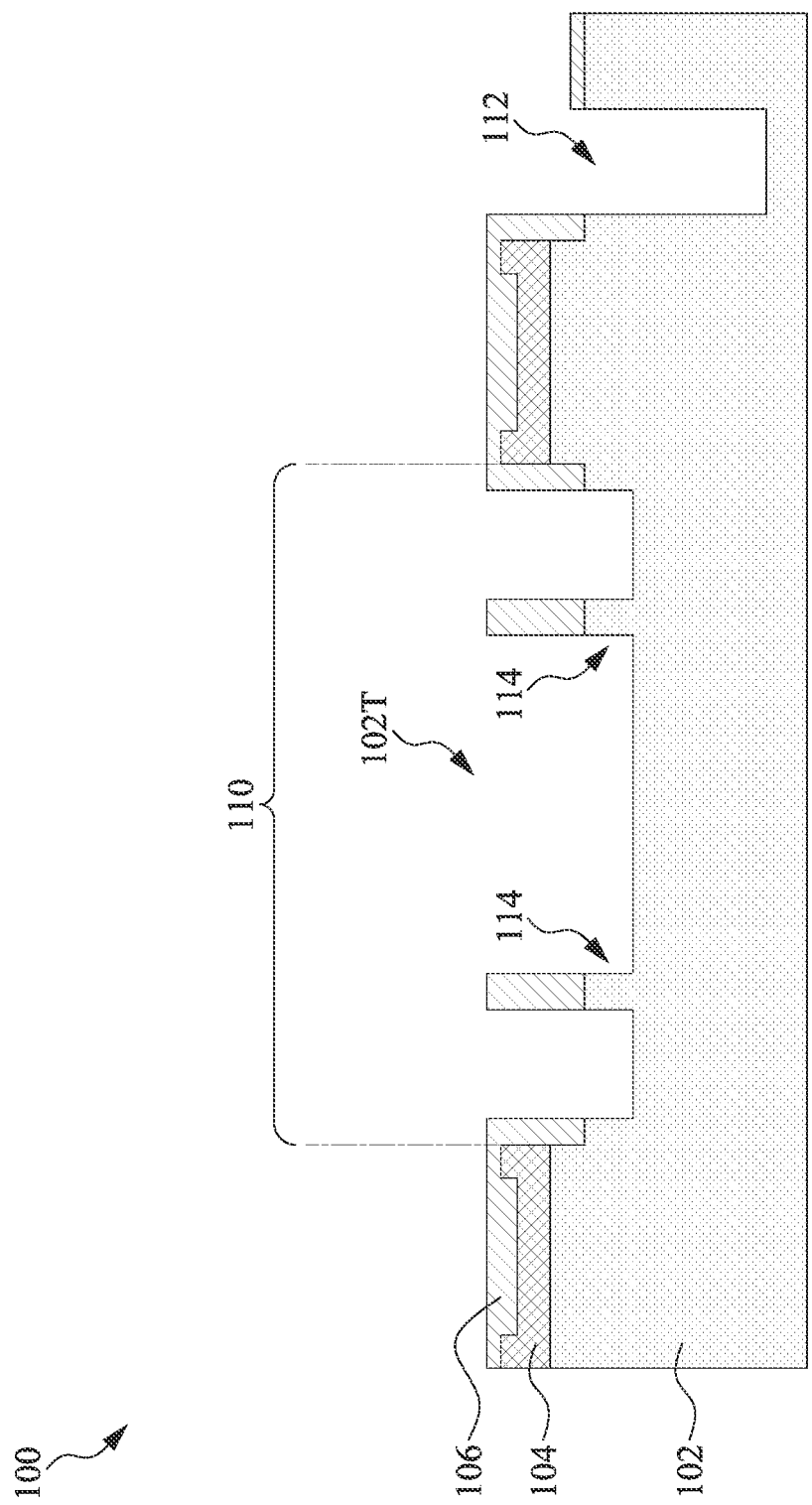
Figure 1G:
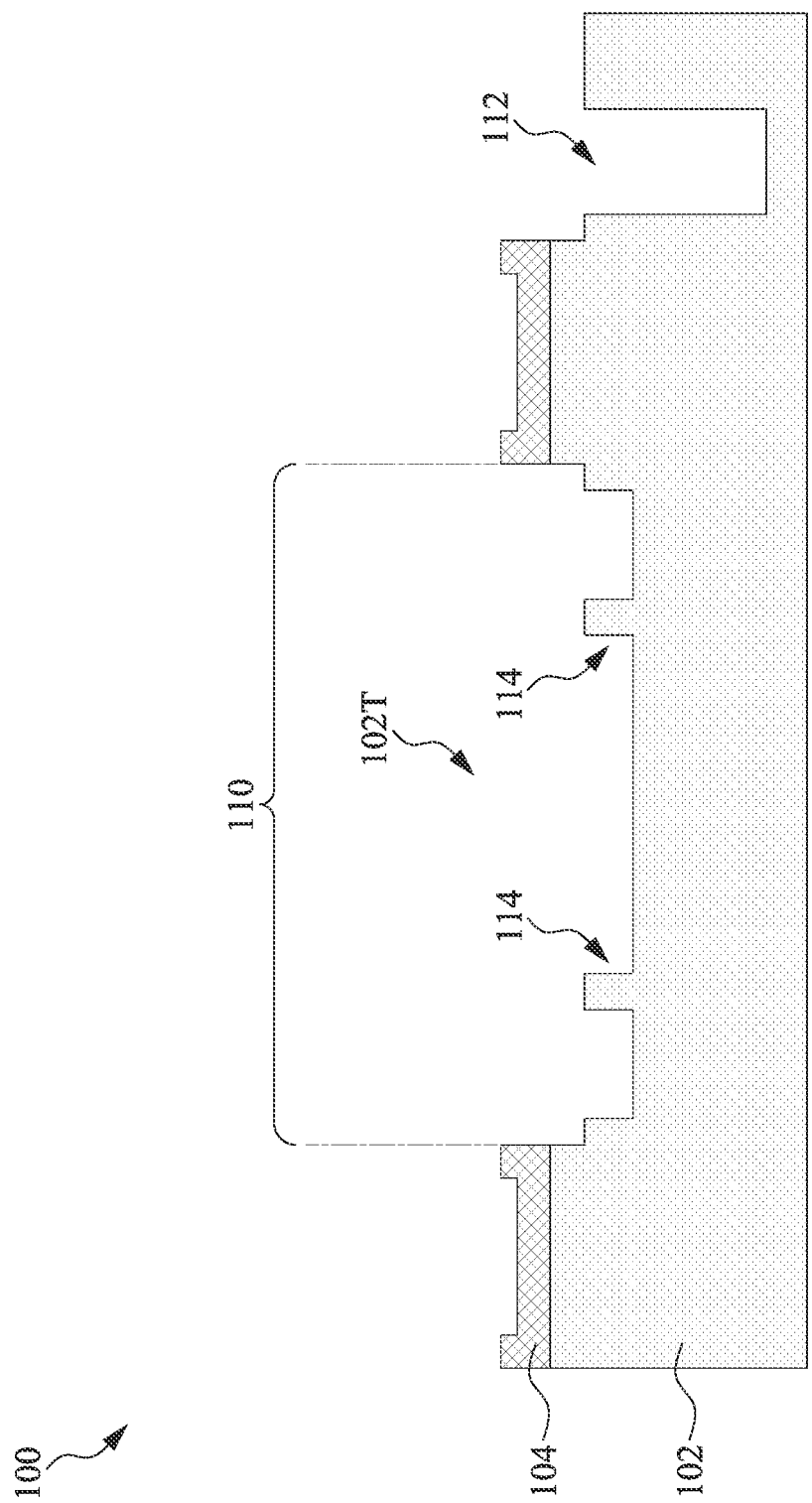
Figure 1H:
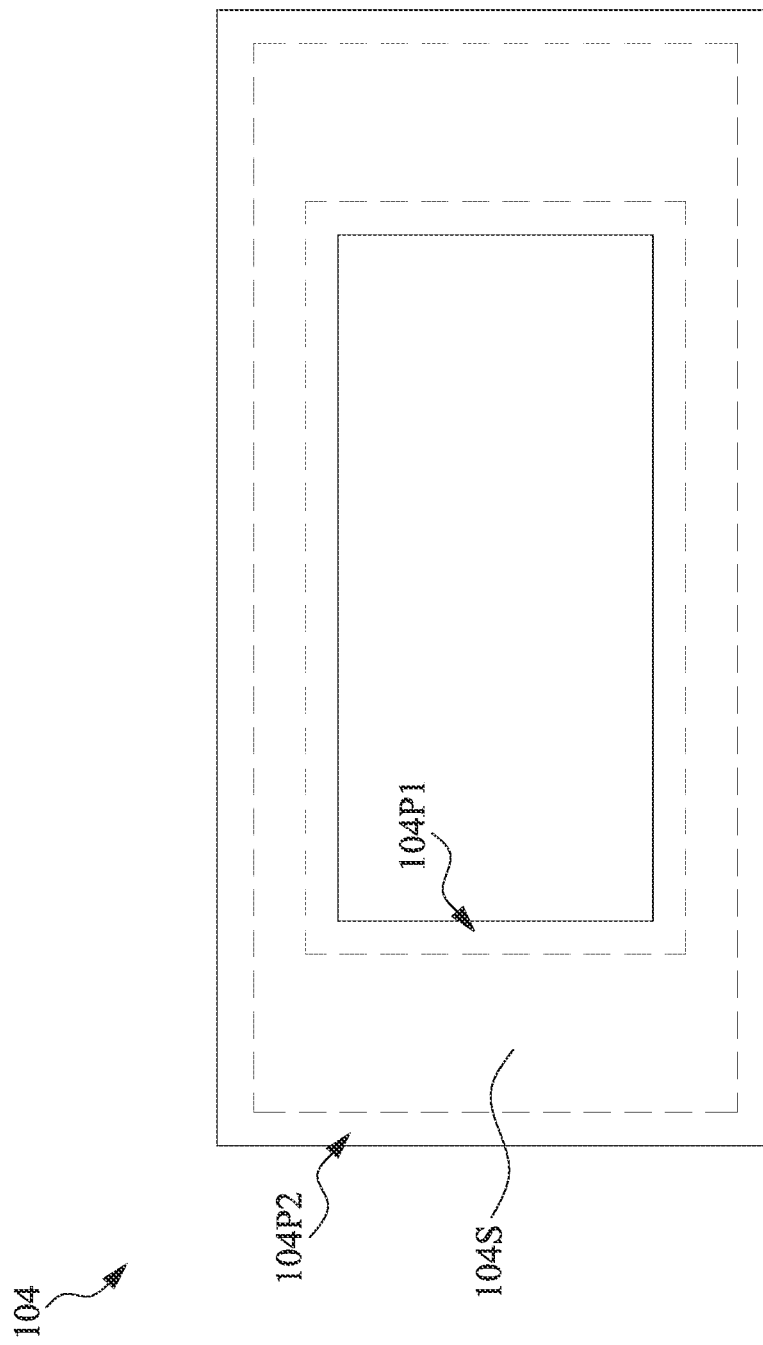
FIG. 1H is a plan view of the cap structure shown in FIG. 1G, in accordance with some embodiments.

FIG. 1H is a plan view of the bonding layer 104 shown in FIG. 1B, in accordance with some embodiments. Referring to FIG. 1B and FIG. 1H, through the patterning operation of FIG. 1B, the bonding layer 104 defines a ring of a polygonal shape or a circular shape from a top-view perspective, in which the bonding layer 104 is also referred as a bonding ring. The bonding layer 104 includes an inner region with an upper surface 104S, which corresponds to the recess 104R, and protrusions 104P protruding from the upper surface 104S. The recess 104R can be regarded as a cavity of the bonding layer 104. In some embodiments, the upper surface 104S is substantially planar or flat, while the protrusion 104P is higher than the surface 104S by the depth P1. As illustrated in FIG. 1H, the protrusions 104P may include an inner protrusion 104P1 and an outer protrusion 104P2 on two sides of the surface 104S. In some embodiments, the ring area of the upper surface 104S, the inner protrusion 104P1 and the outer protrusion 104P2 form concentric rings or concentric polygons. Referring to FIG. 1B, the bonding layer 104 and the protrusion 104P1 or P2 respectively include a first width W1 and a second width D1 from a cross-sectional view. In some embodiments, the first width W1 is in a range between about 25 nm and about 80 nm, or between about 30 nm and about 50 nm, such as 40 nm. In some embodiments, a width ratio R1 between the second width D1 and the first width W1 is between about 10% and about 50%, between about 20% and about 40% or between about 25% and about 40%.

Referring to FIG. 1C, a mask layer 106 is formed over the substrate 102 and the bonding layer 104. In the depicted embodiment, the mask layer 106 includes a dielectric material, such as silicon oxide. However, other suitable dielectric materials, such as silicon nitride or silicon carbide, may be additionally or alternatively used as the mask layer 106. The mask layer 106 is formed over the substrate 102 and the bonding layer 104 using CVD, PVD, ALD, spin-coating, or other suitable deposition methods.

Referring to FIG. 1D, the mask layer 106 is patterned using a lithography process and an etching process to thereby form recesses 106R exposing the substrate 102. The remaining portions of the patterned mask layer 106 include a first portion covering the bonding layer 104 and a second portion in the trench 102T surrounded by the bonding layer 104. In the present embodiment, the second portion of the mask layer 106 defines the geometries of one or more stopper structures of an MEMS device.

Referring to FIG. 1E, another patterned mask layer 108 is formed over the substrate 102 and the patterned mask layer 106. The mask layer 108 may include a dielectric material, such as silicon nitride, silicon oxide, silicon carbide, silicon oxynitride, or other suitable materials. In some embodiments, the patterned mask layer 108 include a different material from the patterned mask layer 106. The patterned mask layer 108 is deposited over the substrate 102 and the patterned mask layer 106 using CVD, PVD, ALD, or other suitable deposition methods, and then patterned by a lithography process and an etching process. In the depicted embodiment, the patterned mask layer 108 defines the geometry of a plurality cap structures 100 in the substrate 102. Subsequently, the substrate 102 is patterned using the patterned mask layer 108 as an etch mask. The patterning operation of FIG. 1E may be performed to form a plurality of trenches 112 (only one example trench 112 is shown in FIG. 1E) using a dry etch, a wet etch, a combination thereof, or the like. The configuration of the trenches 112 may be used as a boundary between adjacent cap structures 100 in the substrate 102. The depth of the trench 112 may be greater than the depth of the trench 102T. In some embodiments, the depth of the trench 112 is determined by or related to a height of the cap structure 100.

Referring to FIG. 1F, after the trench 112 is formed, the patterned mask layer 108 is removed, e.g., by wet stripping or plasma ashing. The patterned mask layer 106 is left over the substrate 102 after the patterned mask layer 108 is removed. The substrate 102 is further patterned using the patterned mask layer 106 as an etch mask, thereby etching the substrate 102 further downward and causing the trench 102T deeper. A mesa including a ring shape or a polygonal shape and aligned with the bonding layer 104 is thus formed in the substrate 102 through the patterning operation. A cavity 110 is formed in the interior of the bonding layer 104. Furthermore, one or more stopper structures 114 are also formed on the upper surface of the substrate 102 in the cavity 110.

Referring to FIG. 1G, the patterned mask layer 106 is removed. The removal of the patterned mask layer 106 may be performed by a suitable process, such as hydro-fluorine (HF) etching. Therefore, the substrate 102 is formed as a cap substrate including a plurality of cap structures 100.

FIG. 2A to FIG. 2H are cross-sectional views of intermediate stages of a method of manufacturing a cap structure 200, in accordance with some embodiments. The cap structure 200 is similar to the cap structure 100 in many aspects, and these similar features will not be repeated in the discussion with reference to FIG. 2A to FIG. 2H for brevity. The cap structure 200 is different from the cap structure 100 mainly in the configuration of the bonding layer 204, e.g., the shapes and locations of the protrusions 204P, 204Q of the bonding layer 204, as described in greater detail later.

Figure 2A:
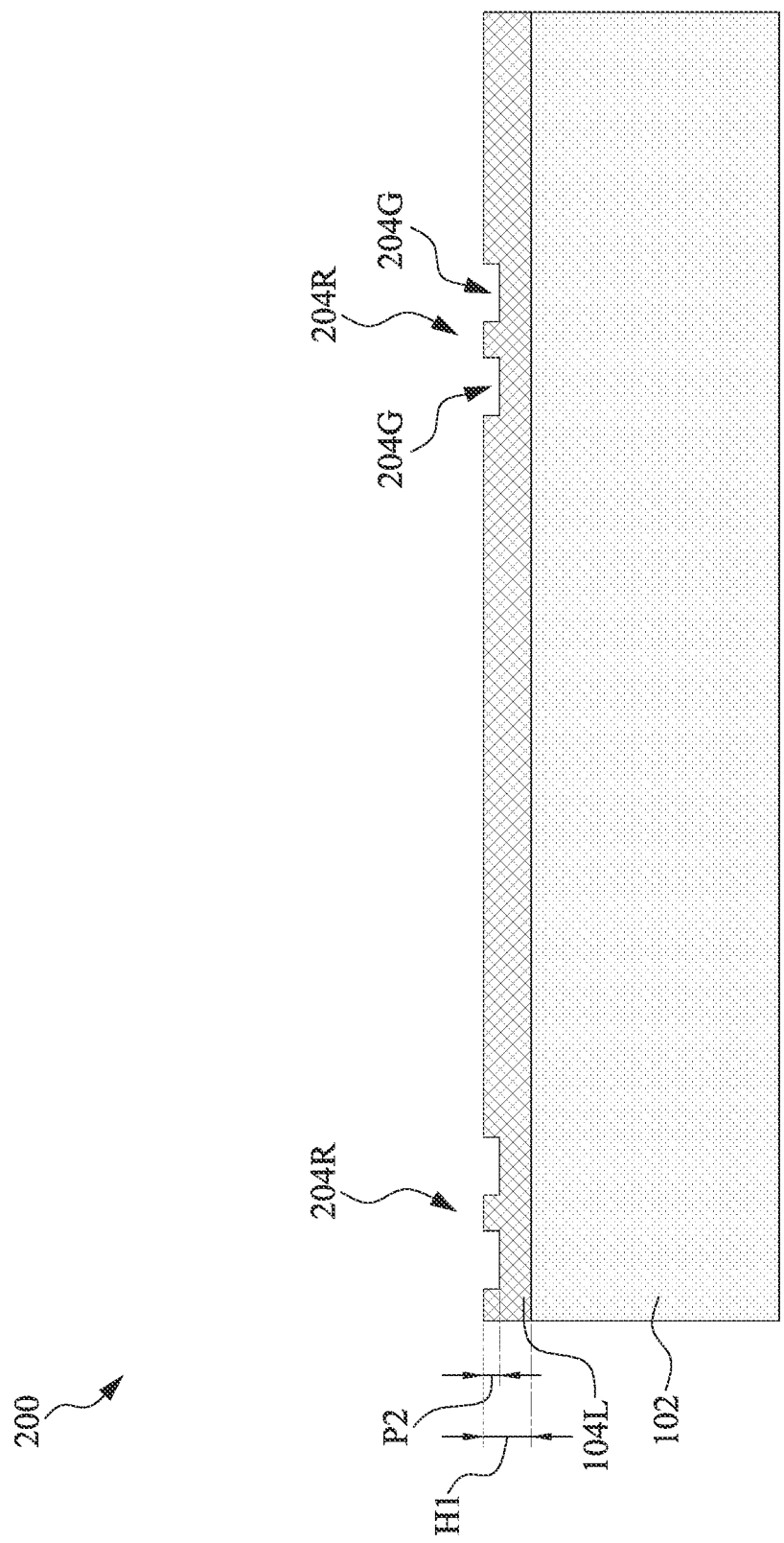
FIG. 2A to FIG. 2H are cross-sectional views of intermediate stages of a method of manufacturing a cap structure, in accordance with some embodiments.

Referring to FIG. 2A, the substrate 102 is provided or received. In an embodiment, the material layer 104L is deposited over the substrate 102. The material layer 104L may include suitable materials for eutectic bonding, such as germanium, aluminum, aluminum copper, gold, silver, indium, tin, alloys thereof, or the like. The material layer 104L is patterned to form recesses 204R on an upper surface of the material layer 104L. The patterning operation may be performed using a lithography process and an etching process. The material layer 104L is then etched to form the recesses 204R, wherein the etch may be performed using a dry etch, a wet etch, a combination thereof, or the like. Through the patterning operation on the material layer 104L, the recess 204R has a depth P2 in a range between about 300 angstrom and about 1500 angstrom, e.g., 500 angstrom. The depth P2 is less than the depth P1 of the cap structure 100. In some embodiments, a ratio between the depth P2 and the height H1 of the material layer 104L is between about 5% and about 30%, e.g., 10%. In some embodiments, a ratio between the depth P2 and the depth P1 is between about 20% and about 80%, or between about 30% and about 70%, e.g., 50%. In the present embodiment, the recesses 204R on the material layer 104L define two regions 204G each including a ring shape, a polygonal shape or a circular shape to serve as a bonding ring from a top-view perspective, and is similar to the inner region labelled as 104S shown in FIG. 1H.

Figure 2B:
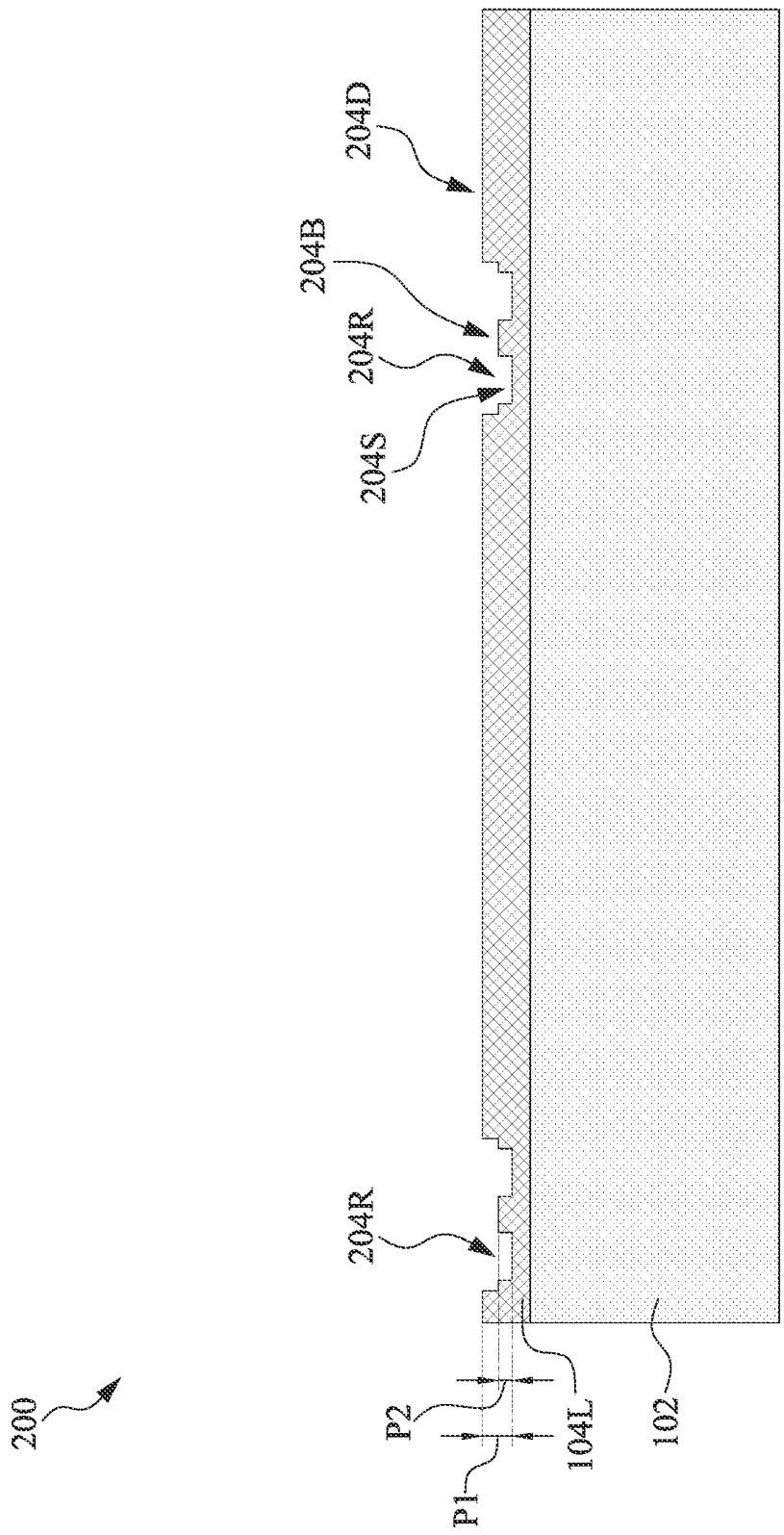

Referring to FIG. 2B, another patterning operation is adopted to pattern the material layer 104L and the substrate 102. The patterning operation of FIG. 2B is similar to that shown with reference to FIG. 1A. Through the patterning operation the recesses 204R are etched further downward. In some embodiments, the patterned material layer 104L includes a stepped profile having at least three surfaces 204D, 204B and 204S at different levels associated with the two etching depths P1 and P2.

Figure 2C:
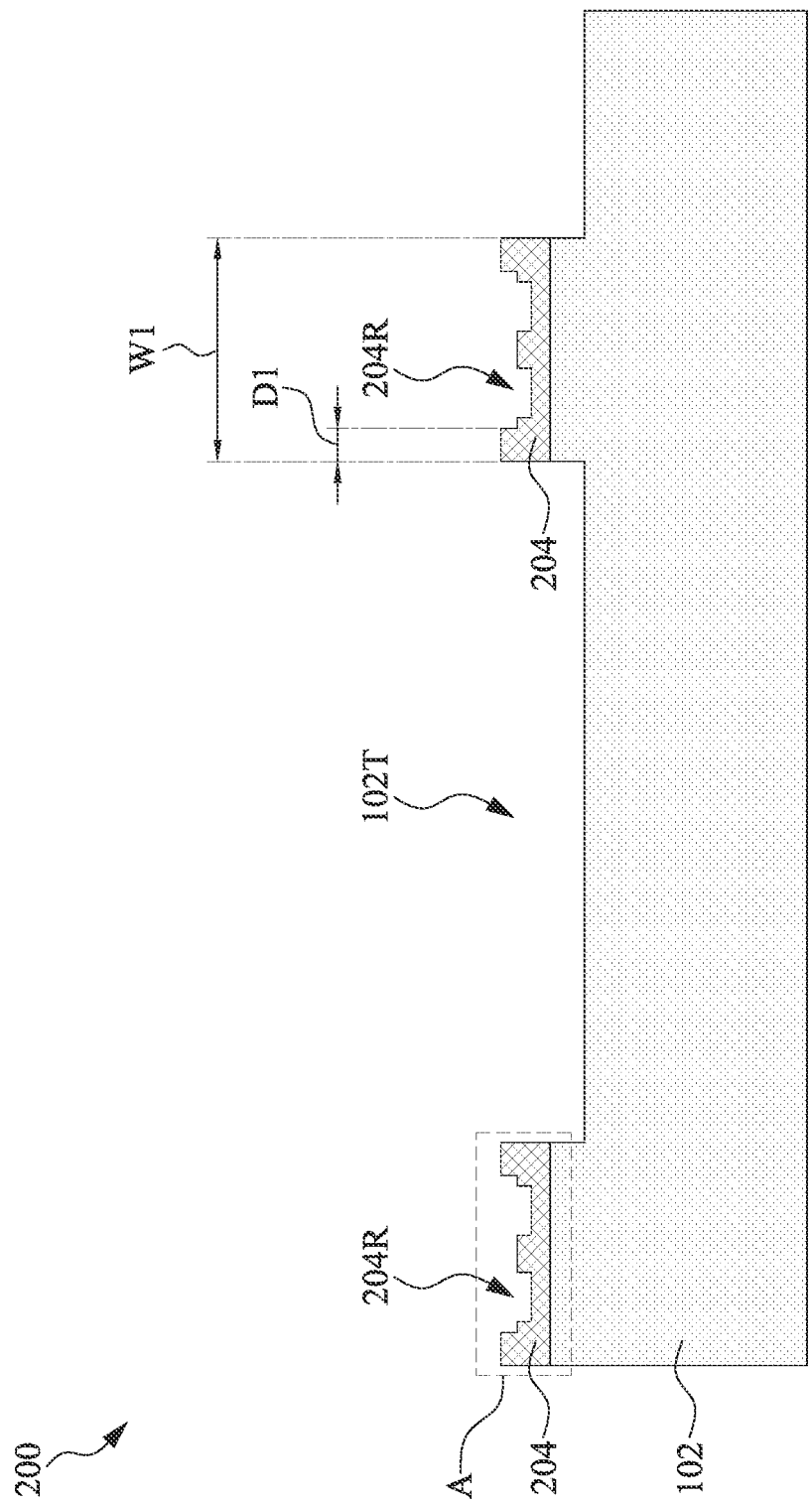

Referring to FIG. 2C, yet another patterning operation is adopted to pattern the material layer 104L and the substrate 102 to thereby form a bonding layer 204 over the substrate 102. The patterning operation of FIG. 2C is similar to that shown with reference to FIG. 1B. In an embodiment, the patterning operation of FIG. 2C defines a ring shape or a polygonal shape on the material layer 104L and includes the recesses 204R. A first etch operation is applied to the material layer 104L to form the bonding layer 204. The trench 102T is subsequently formed by the same patterning operation of forming the bonding layer 204, or by another etching operation using the bonding layer 204 as an etch mask. The recesses 204R can be regarded as a cavity of the bonding layer 204.

Figure 2D:
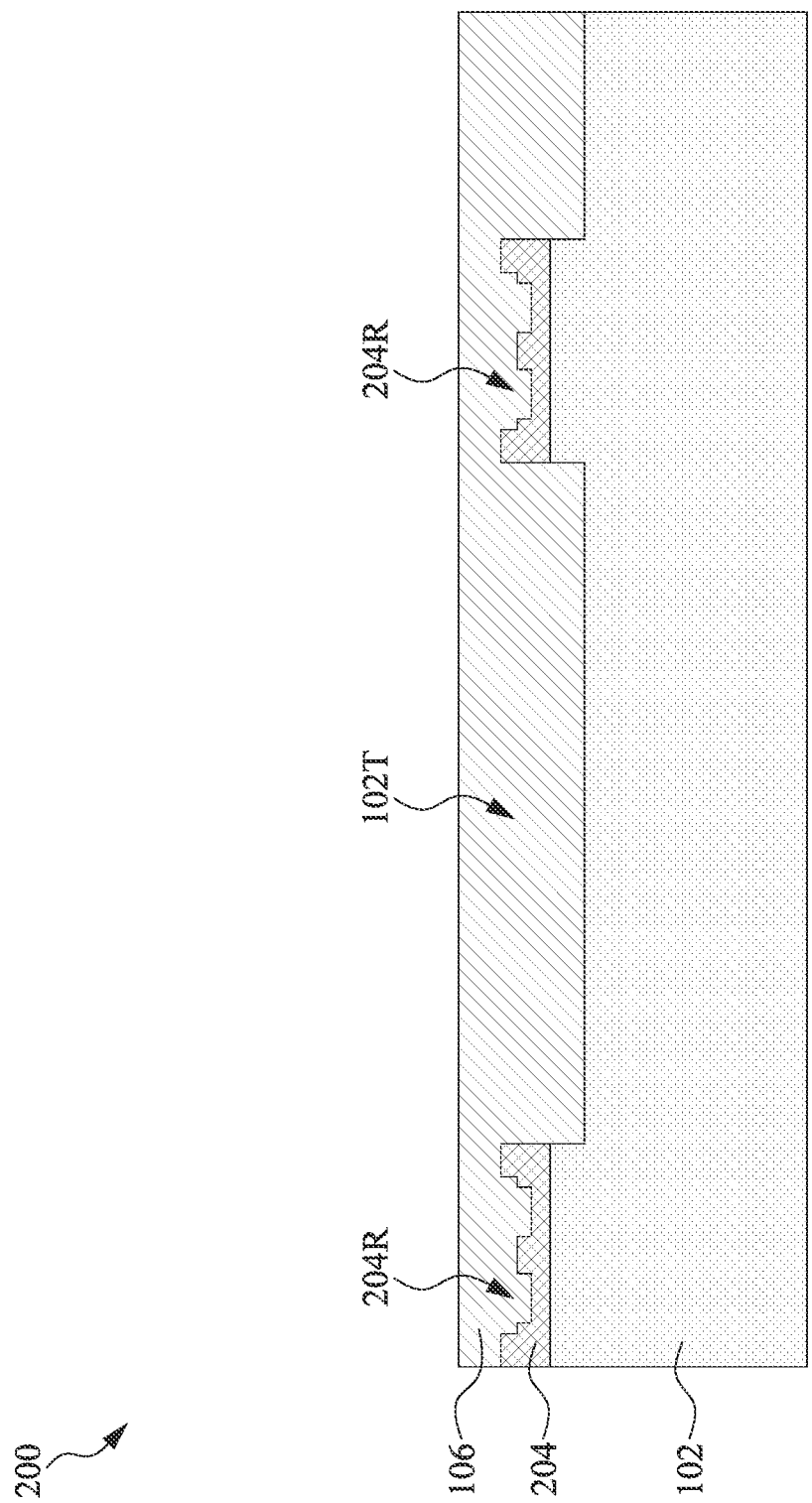
Figure 2E:
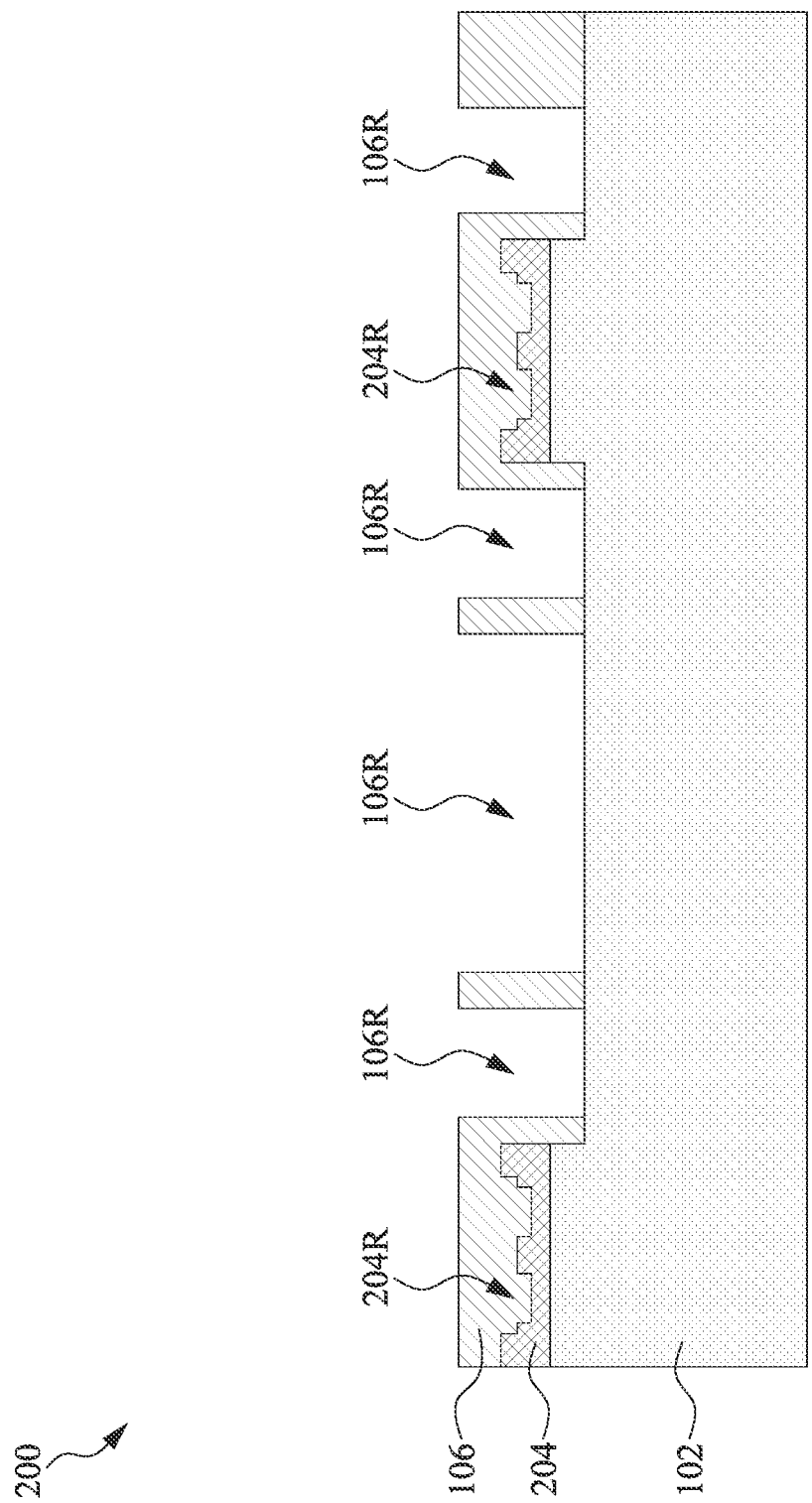
Figure 2F:
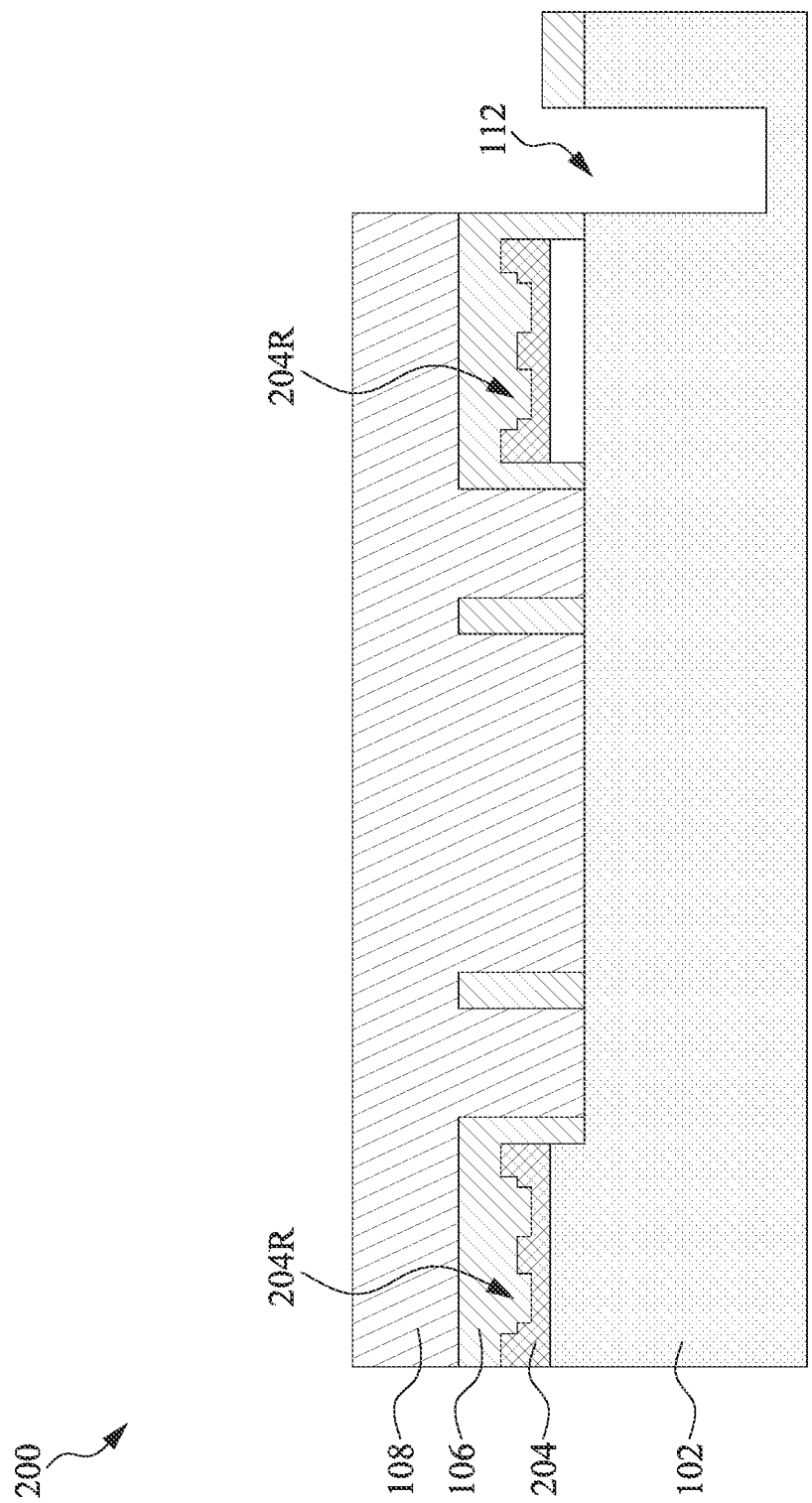
Figure 2G:
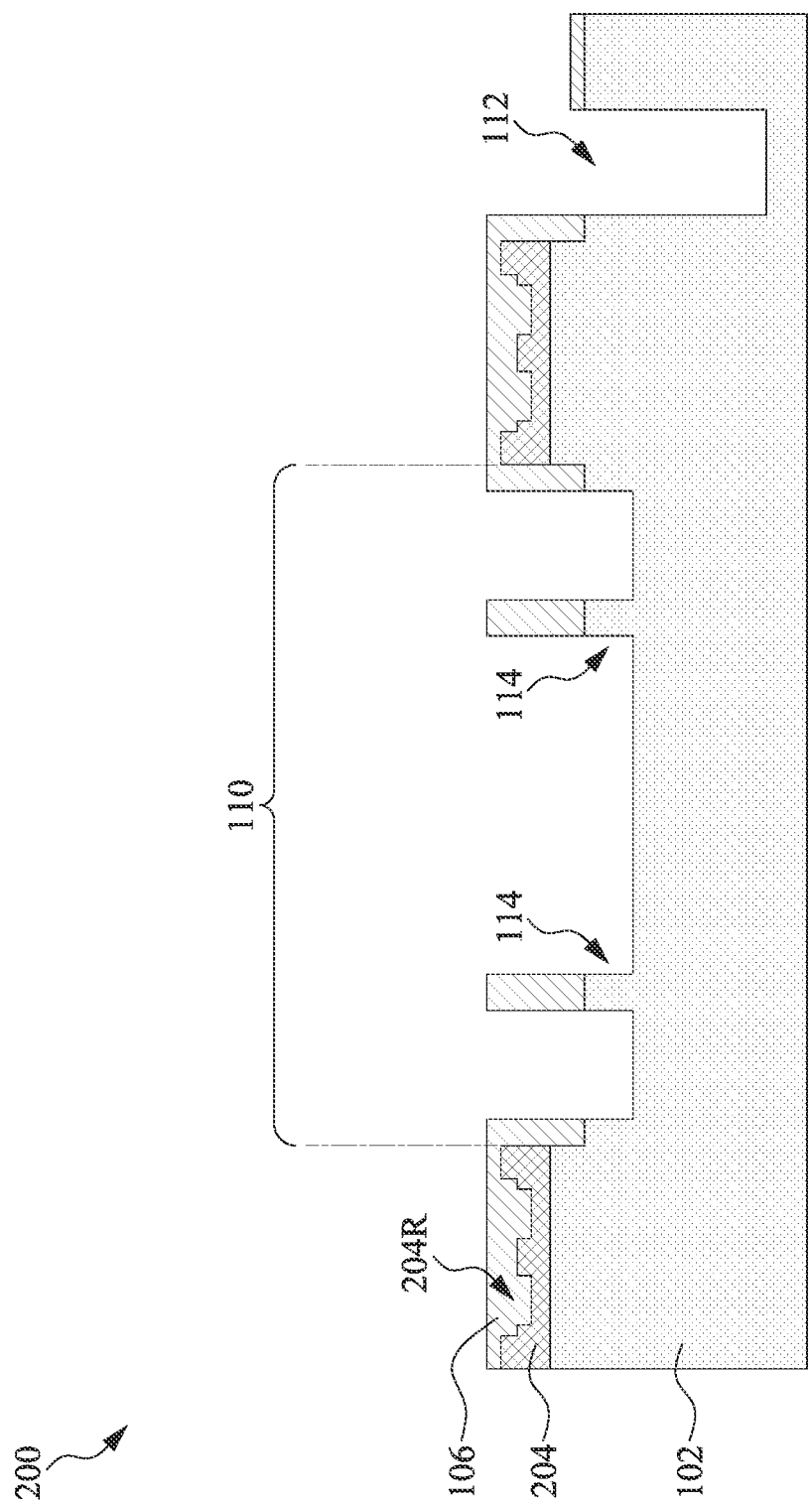
Figure 2H:
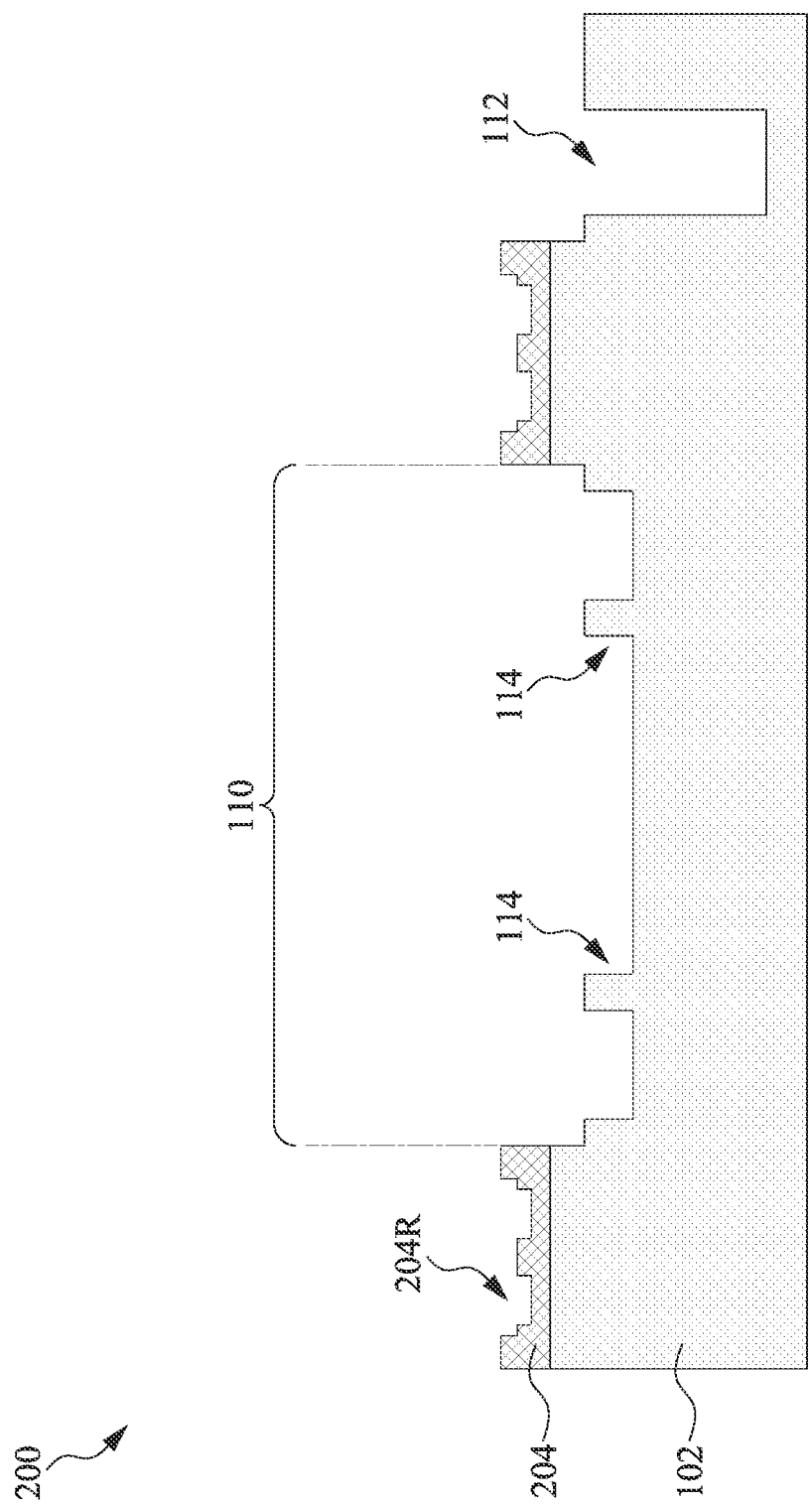
Figure 2I:
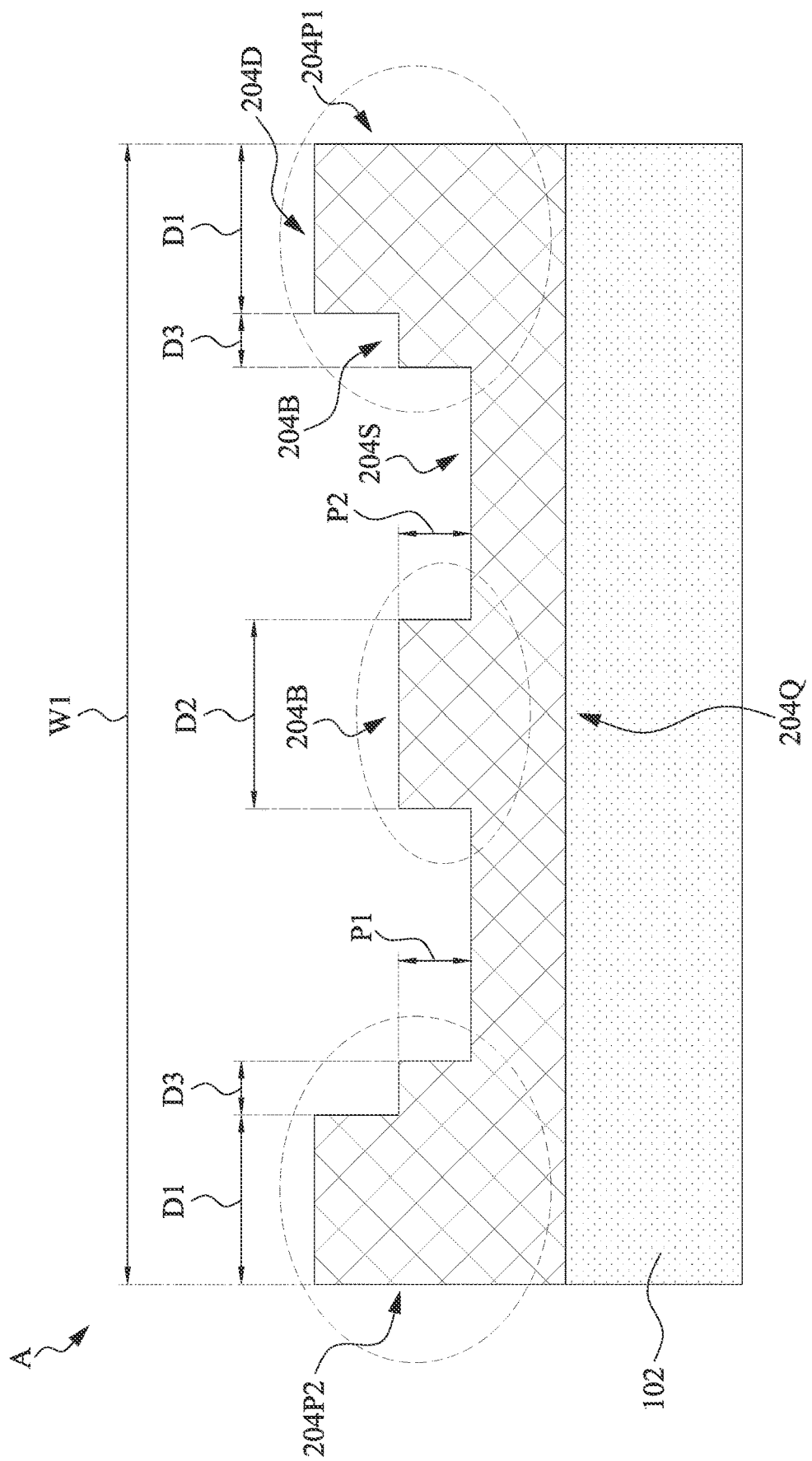
FIG. 2I is an enlarged view of a cross-sectional view of a bonding layer shown in FIG. 2C, in accordance with some embodiments.

FIG. 2I is an enlarged view of an area A around the bonding layer 204 in FIG. 2C, in accordance with some embodiments. As illustrated in FIG. 2I, the bonding layer 204 includes first protrusions 204P, e.g., an inner protrusion 204P1 and an outer protrusion 204P2, which are similar to the inner protrusion 104P1 and the outer protrusion 104P2, respectively, of the bonding layer 104 in the cap structure 100, as illustrated in FIG. 1H. The first protrusions 204P may be different from the protrusions 104P in that each of the first protrusions 204P include a stepped surface, e.g., the surface of the first protrusion 204P includes two steps with planar surfaces 204D and 204B over the planar surface 204S, in which the surface 204S is the upper surface of the bonding layer 204.

The bonding layer 204 further includes a second protrusion 204Q between the inner protrusion 204P1 and the outer protrusion 204P2. The first protrusions 204P and the second protrusion 204Q may be formed as a ring shape, a polygonal shape or a circular shape, in a manner similar to the protrusion 204P1 or 204P2. Through the two-step patterning operations with reference to FIG. 2A and FIG. 2B, the first protrusions 204P includes two steps with the planar surfaces 204D and 204B, in which the surface 204D has a width 2×D2 at the height of P1 measured from the surface 204S and the surface 204B has a width D2+2×D3 at the height of P2 measured from the surface 204S. Similarly, the second protrusion 204Q includes a single-step surface 204B at the height P2 measured from the surface 204S. In some embodiments, the ring area of the upper surface 204S, the first protrusions 204P and the second protrusion 204Q form concentric rings or concentric polygons.

In some embodiments, the second protrusion 204Q has a third width D2 from a cross-sectional view. The third width D2+2×D3 may be greater than, equal to, or less than the second width D1. In some embodiments, a width ratio between the third width D2+2×D3 and the first width W1 is between about 10% and about 50%, between about 20% and about 40%, or between about 25% and about 30%. In some embodiments, a width ratio between the third width D2 and the second width D1 is between about 30% and about 150%, between about 60% and about 120%, or between about 85% and about 120%, e.g., 100%.

Referring to FIG. 2D, the mask layer 106 is formed over the substrate 102 and the bonding layer 204, in a manner similar to that performed in FIG. 1C. The mask layer 106 is formed over the substrate 102 and the bonding layer 204, and fills the recesses 204R and the trench 102T.

Referring to FIG. 2E, the mask layer 106 is further patterned using a lithography process and an etching process to form recesses 106R exposing the substrate 102, in a manner similar to that performed in FIG. 1D. Referring to FIG. 2F, the patterned mask layer 108 is formed over the substrate 102 and the patterned mask layer 106, in a manner similar to that performed in FIG. 1E. Subsequently, the substrate 102 is patterned using the patterned mask layer 108 as an etch mask. The patterning operation of FIG. 2F may be performed to form a plurality of trenches 112.

Referring to FIG. 2G, after the trenches 112 are formed, the patterned mask layer 108 is removed, e.g., by wet stripping or plasma ashing, in a manner similar to that performed in FIG. 1F. The patterned mask layer 106 remains over the substrate 102 through the removal of the patterned mask layer 108. The cavity 110 is formed in the interior of the bonding layer 204. Furthermore, one or more stopper structures 114 are also formed on the upper surface of the substrate 102 in the cavity 110. Referring to FIG. 2H, the patterned mask layer 106 is removed, in a manner similar to that performed in FIG. 1G. Therefore, the substrate 102 is formed as a cap substrate including a plurality of cap structures 200.

Figure 2J:
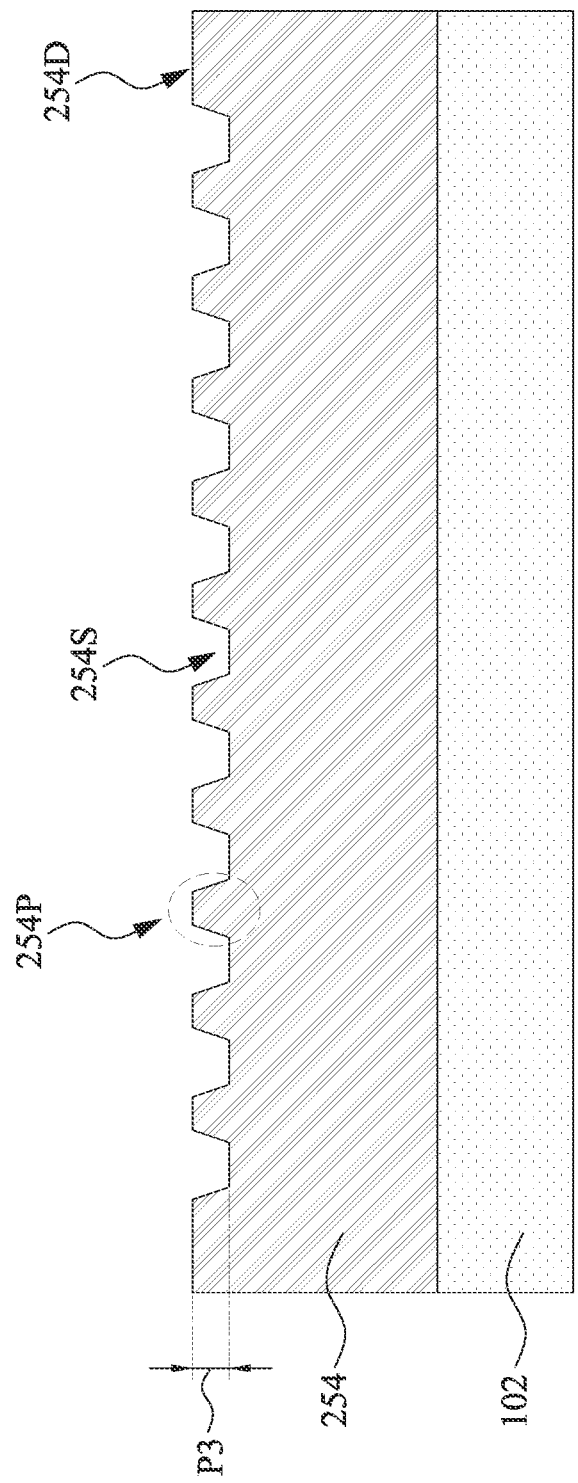
FIG. 2J is a cross-sectional view of a bonding layer, in accordance with some embodiments.

FIG. 2J is a cross-sectional view of a bonding layer 254, in accordance with some embodiments. The bonding layer 254 is similar to the bonding layer 104 or 204, and these similar features are not repeated for brevity. The bonding layer 254 is different from the bonding layer 104 or 204 mainly in that the bonding layer 254 includes more than three protrusions 254P from a cross-sectional view. In some embodiments, the protrusions 254P are uniformly or non-uniformly distributed on and protruding from the planar surface 254S. In some embodiments, the multiple protrusions 254P may have planar surfaces 254D with substantially equal heights or different heights P3.

Referring to FIG. 1G, FIG. 2H and FIG. 2I, the sidewalls of the protrusions 104P, 204P, 254P may have the same or different profiles. For example, the sidewalls of the bonding layer 104 or 204 at the protrusions 104P, 204P and 204Q are parallel to each other or perpendicular to the corresponding planar surface 104S or 204S. Alternatively, the protrusions 254P of the bonding layer 254 may include non-parallel sidewalls. The protrusions 254P may have sidewalls tapered from the planar surface 254S to the top surface 254D of the protrusions 254P. In some embodiments, the protrusion 254P includes a tip portion having a width less than a width of the protrusion 254P at the bottom portion.

FIG. 3A to FIG. 3F are cross-sectional views of intermediate stages of a method of manufacturing a semiconductor device 300, in accordance with some embodiments. The semiconductor device 300 may be combined with the cap structure 100 or 200 to implement a MEMS device, a package device, a 3DIC device, or the like.

Figure 3A:
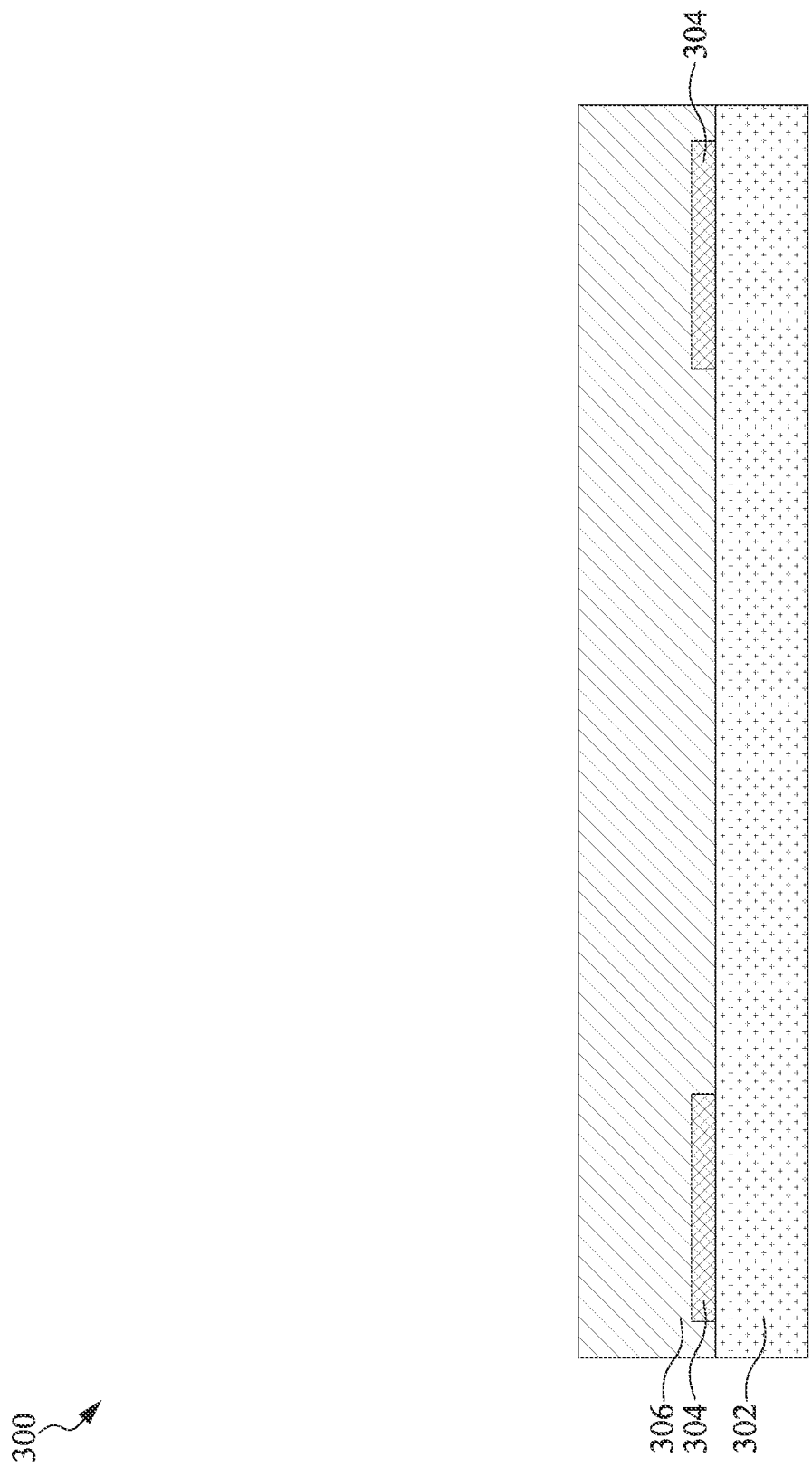
FIG. 3A to FIG. 3F are cross-sectional views of intermediate stages of a method of manufacturing a semiconductor device, in accordance with some embodiments.

Referring to FIG. 3A, a substrate 302 is received or provided. The substrate 302 includes a bulk semiconductor material such as silicon. In some embodiments, the substrate 302 may include other semiconductor materials, such as silicon germanium, silicon carbide, gallium arsenide, or the like. In some embodiments, the substrate 302 is a p-type semiconductive substrate (acceptor type) or an n-type semiconductive substrate (donor type). Alternatively, the substrate 302 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In yet another embodiment, the substrate 302 is a semiconductor-on-insulator (SOI) substrate. In other alternatives, the substrate 302 may include a doped epitaxial layer, a gradient semiconductor layer, or a semiconductor layer overlaying another semiconductor layer of a different type, such as a silicon layer on a silicon germanium layer.

Various electrical components of one or more semiconductor devices may be formed on a front surface (front side) of the substrate 302. Examples of the electrical components include active devices, such as transistors and diodes, and passive devices, such as capacitors, inductors, and resistors. The electrical components may also include conductive features, such as conductive lines or conductive vias, and insulating features electrically insulating the conductive features. In some embodiments, the substrate 302 comprises one or more connection terminals (not shown) on the front surface that are utilized to electrically couple the electrical components of the substrate 302 to external circuits or devices.

In some embodiments, a redistribution layer (RDL), also referred to as an interconnect layer, (not separately shown) is formed on a top layer of the substrate 302. The RDL is configured to electrically interconnect its overlying components. Additionally or alternatively, the RDL is configured to electrically couple its overlying components with the electrical components of the substrate 302. The RDL may include multiple metal line layers and metal via layers. Each of the metal line layers may include conductive wires or lines and be electrically coupled to an adjacent overlaying or underlying metal line layer through metal vias of a metal via layer between the adjacent metal line layers.

The metal lines and the metal vias in the respective metal line layers and metal via layers are electrically insulated from each other to prevent unintended electrical leakage or short circuit. The insulation may be achieved by insulating materials, such as an inter-metal dielectric (IMD) surrounding the metal lines and the metal vias. In the depicted embodiment, since the substrate 302 includes at least one semiconductor devices, the substrate 302 is also referred to as a device substrate.

As illustrated in FIG. 3A, various conductive pads 304 are formed on a top surface of the substrate 302 or a top surface of the RDL of the substrate 302. The conductive pads 304 are formed to electrically connect the underlying circuits of the substrate 302 or the RDL to overlying components or circuits. In some embodiments, the conductive pads 304 includes conductive materials, such as copper, silver, aluminum, gold, tungsten, titanium, titanium nitride, tantalum, tantalum nitride, alloys thereof, combinations thereof, or the like. The conductive pads 304 may be formed by initially depositing a conductive layer formed of conductive materials, followed by lithography and etching operations. In some embodiments, the deposition of the conductive layer may be performed using CVD, PVD, ALD, sputtering, or other suitable deposition methods. In some embodiments, the etching operation include a dry etch, a wet etch, a combination thereof, or the like.

An insulation layer 306 is deposited on the substrate 302 and the conductive pads 304. The insulation layer 306 may include a dielectric material, such as oxide, nitride, oxynitride, or the like, using CVD, PVD, ALD, spin-coating, or other suitable deposition methods. In the depicted embodiment, the insulation layer 306 includes silicon oxide. In some embodiments, the insulation layer 306 includes a single-layer structure or a multilayer structure.

Figure 3B:
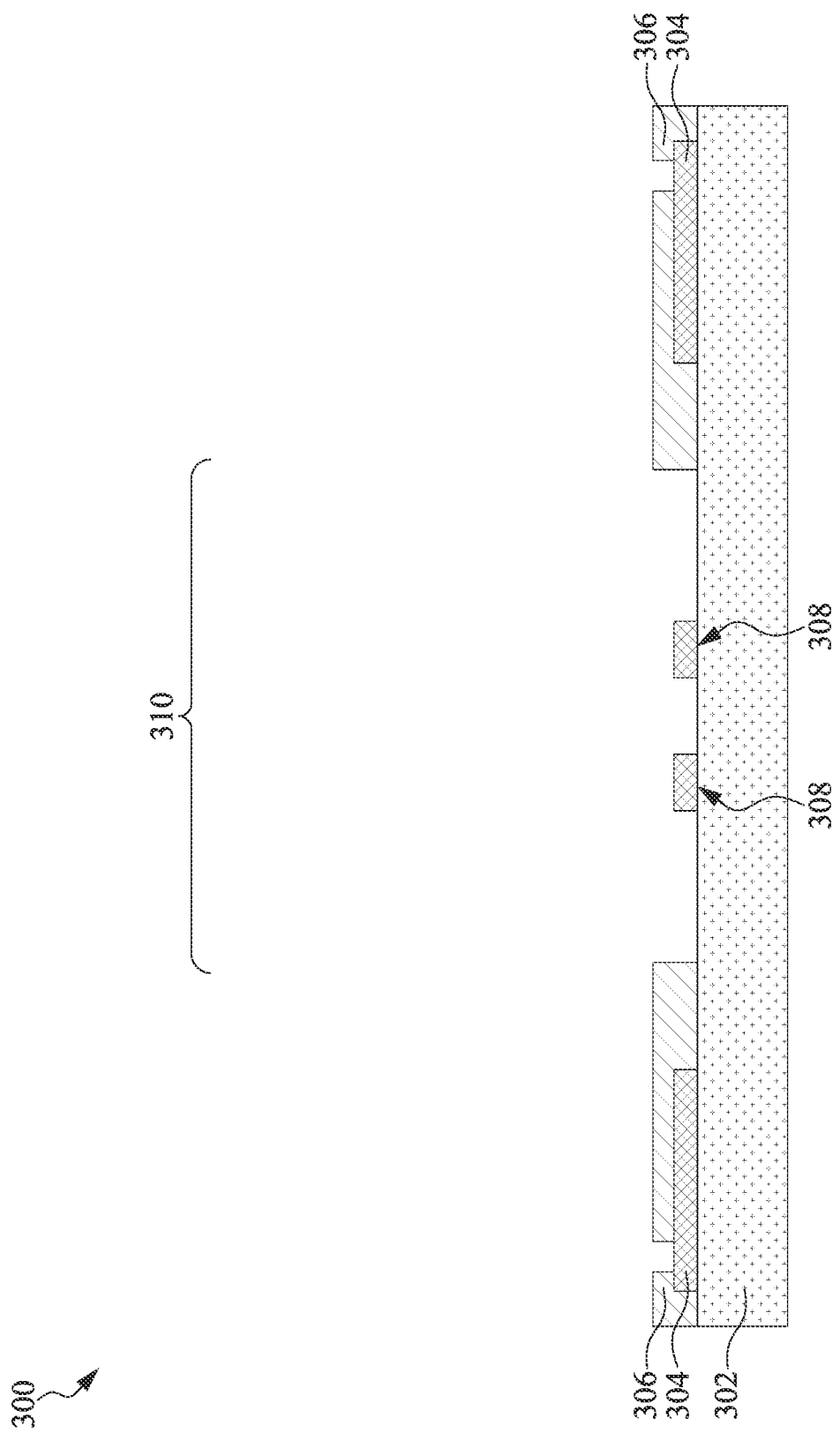

Referring to FIG. 3B, the insulation layer 306 is patterned to form stopper structures 308 and openings 306R. The patterning operation may be performed using lithography and etching operations. In an embodiment, the patterning of the insulation layer 306 includes two steps. In the first step, a recess is formed in the insulation layer 306 within the region where the stopper structures 308 to be formed. A portion of the upper surface of the substrate 302 is also exposed during the first step. In the second step, various openings 306R are formed to expose the conductive pads 304 and the stopper structures 308 are formed in the recessed region. A cavity 310 is also formed in the second step. Each of the first step and the second step may include respective lithography and etching operations.

Figure 3C:
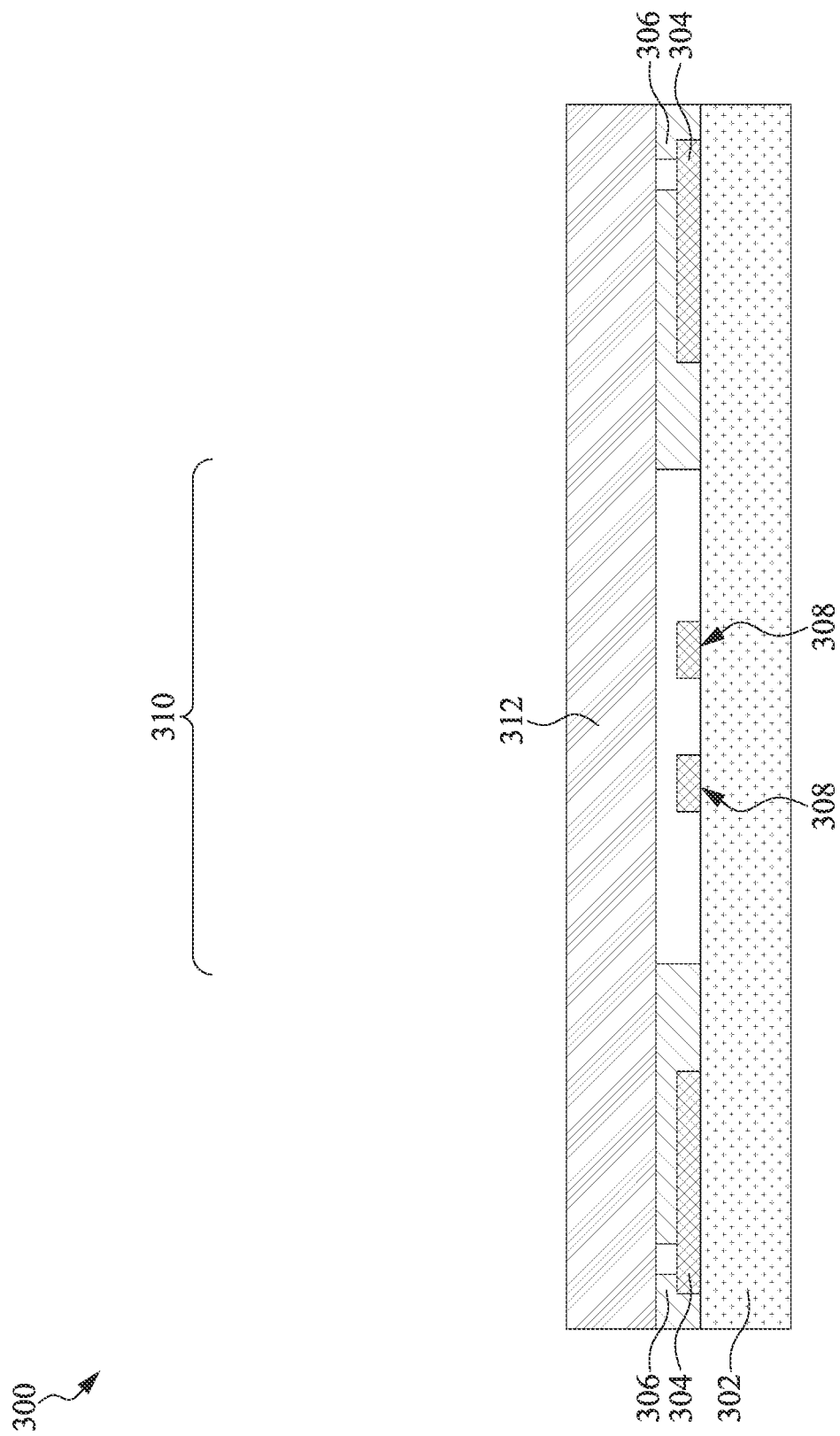

Referring to FIG. 3C, another substrate 312 is bonded to the substrate 302 using fusion bonding. The substrate 312 may be formed of a material similar to the material of the substrate 302 or 102. In some embodiments, the substrate 312 is a silicon substrate. Alternatively, the substrate 312 may be formed of other semiconductor materials, such as germanium. The substrate 312 is used to form MEMS features of the semiconductor device 300, and thus in the depicted embodiment the substrate 312 is also referred to as a MEMS substrate. In some embodiments, the substrate 312 is provided in a form of a wafer. In embodiments where the insulation layer 306 is formed of silicon oxide, while the substrate 312 is formed of silicon, and the substrate 312 may be bonded to the substrate 302 through fusion bonding. The fusion bonding is achieved between the silicon oxide of the insulation layer 306 and the silicon atoms of the substrate 312. In some embodiments, a pre-bonding cleaning operation is performed to remove unintended particles or materials. During the bonding of the substrate 312 to the substrate 302, a bonding pressure or force may be applied at an elevated temperature to facilitating surface fusion at the interface between the insulation layer 306 and the substrate 312. In some embodiments, the substrate 312 is thinned down to reduce the thickness after the fusion bonding is completed.

Figure 3D:
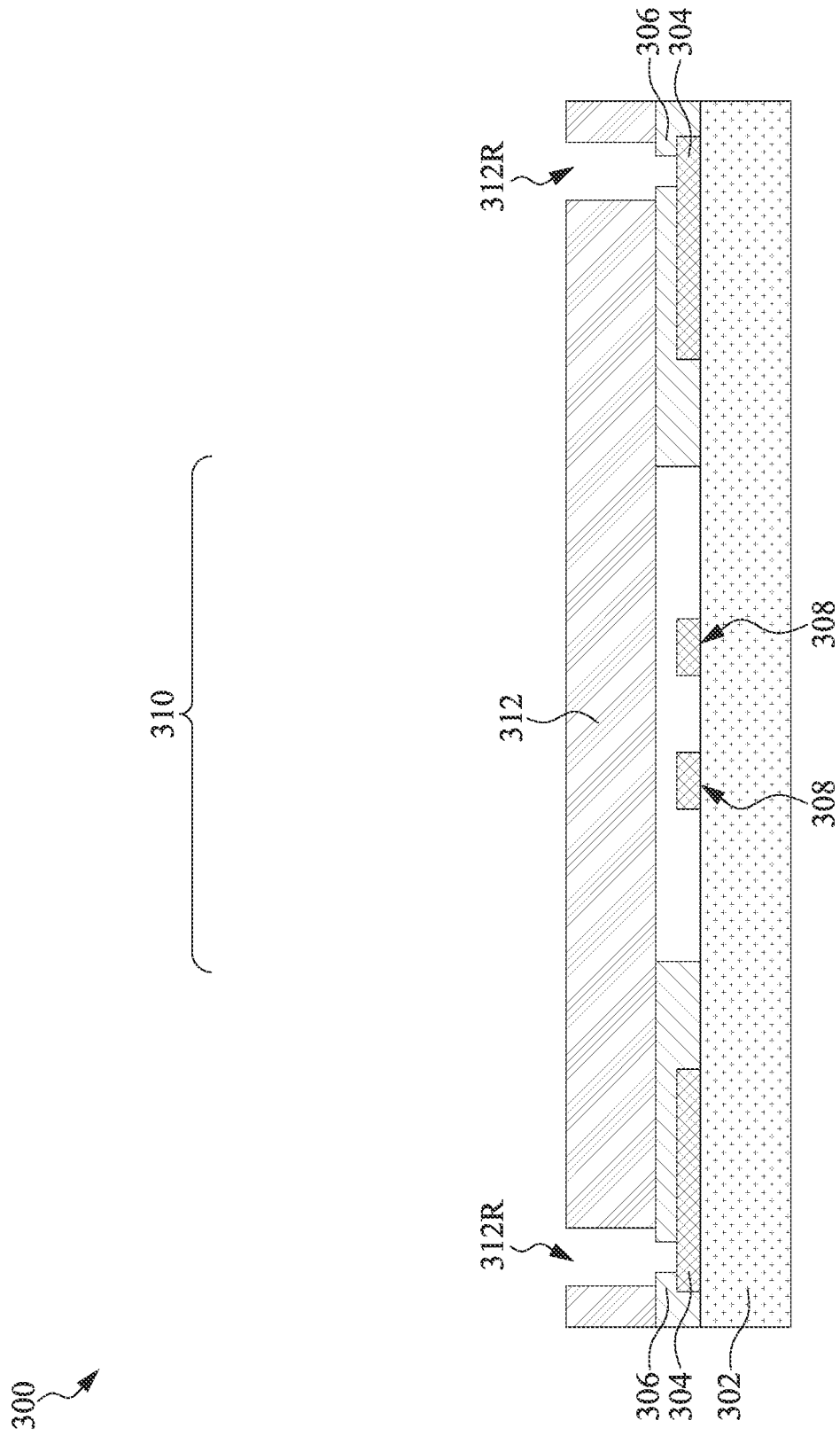

Referring to FIG. 3D, various through vias 312R are formed through the substrate 312. A portion of an upper surface of each of the conductive pads 304 is thus exposed. The through vias 312R may be formed by lithography and etching operations. In some embodiments, a patterned photoresist layer or a hard mask is used as an etch mask during the etching process to form the through vias 312R. The patterned photoresist layer or the hard mask may be removed or stripped after the through vias 312R are formed.

Figure 3E:
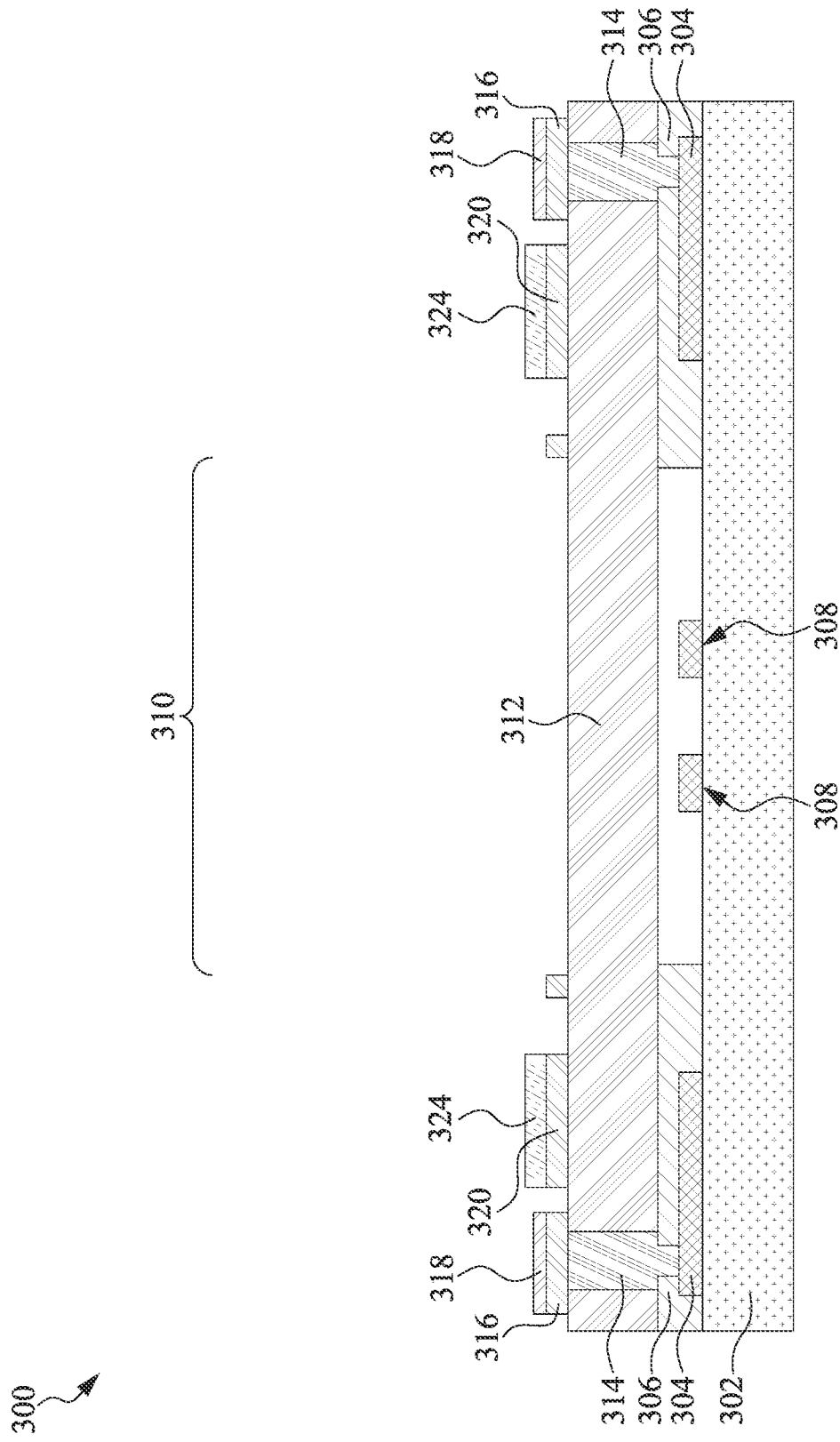

Referring to FIG. 3E, a conductive material is filled in the vias 312R to form conductive vias 314 in the substrate 312. The conductive vias 314 may provide electrical interconnection between the substrate 302 and the substrate 312. In the depicted embodiment, the conductive materials of the conductive vias 314 include copper, silver, aluminum, gold, tungsten, titanium, titanium nitride, tantalum, tantalum nitride, alloys thereof, combinations thereof, or the like. The conductive vias 314 may be formed by CVD, PVD, ALD, sputtering, or other suitable deposition methods. In some embodiments, a planarization operation, e.g., chemical mechanical polishing (CMP), may be utilized to remove excess conductive material and level the upper surface of the conductive vias 314 with the substrate 312.

Subsequently, conductive pads 316 and a bonding layer 320 are formed over the substrate 312 by respective deposition and patterning operations. In the depicted embodiment, the conductive pads 316 and the bonding layer 320 are deposited over the substrate 312 by CVD, PVD, ALD, sputtering or other suitable technique and is further patterned by etching. The conductive pads 316 and the bonding layer 320 may include a bonding material for eutectic bonding, such as germanium, aluminum, aluminum copper, gold, silver, indium, tin, alloys thereof, or the like. In the depicted embodiments, the conductive pads 316 and 320 include aluminum copper. Subsequently, another conductive layer 318 is formed over the conductive pads 316. The conductive layer 318 may include a conductive material, such as titanium nitride, different from the conductive pads 316. The conductive layers 318 are formed to protect the conductive pads 316 from corrosion. In an alternative embodiment, the conductive layer 318 includes other suitable materials, such as tantalum nitride. In the depicted embodiments, although the bonding pads 316 are formed of a eutectic bonding material, they are used as a connection terminal for other electrical connections rather than forming eutectic bonds.

In some embodiments, the bonding layer 320 includes a planar surface 320S (labeled in FIG. 4B) with a width from a cross-section view in a range between about 40 nm and about 120 nm, or between about 60 nm and about 90 nm, such as 70 nm. In the depicted embodiment, the bonding layer 320 includes a ring shape, a polygonal shape, or a circular shape from a top-view perspective for forming a sealed cavity with the cap structure 100 or 200. In some embodiments, the formation of the bonding layer 320 is performed under an atmosphere condition, e.g., being exposed to air, without vacuum. As a result, once the bonding layer 320 is formed, an upper surface of the bonding layer 320 is exposed to oxygen and a thin oxide layer 324 is thus formed on the bonding layer 320.

Figure 3F:
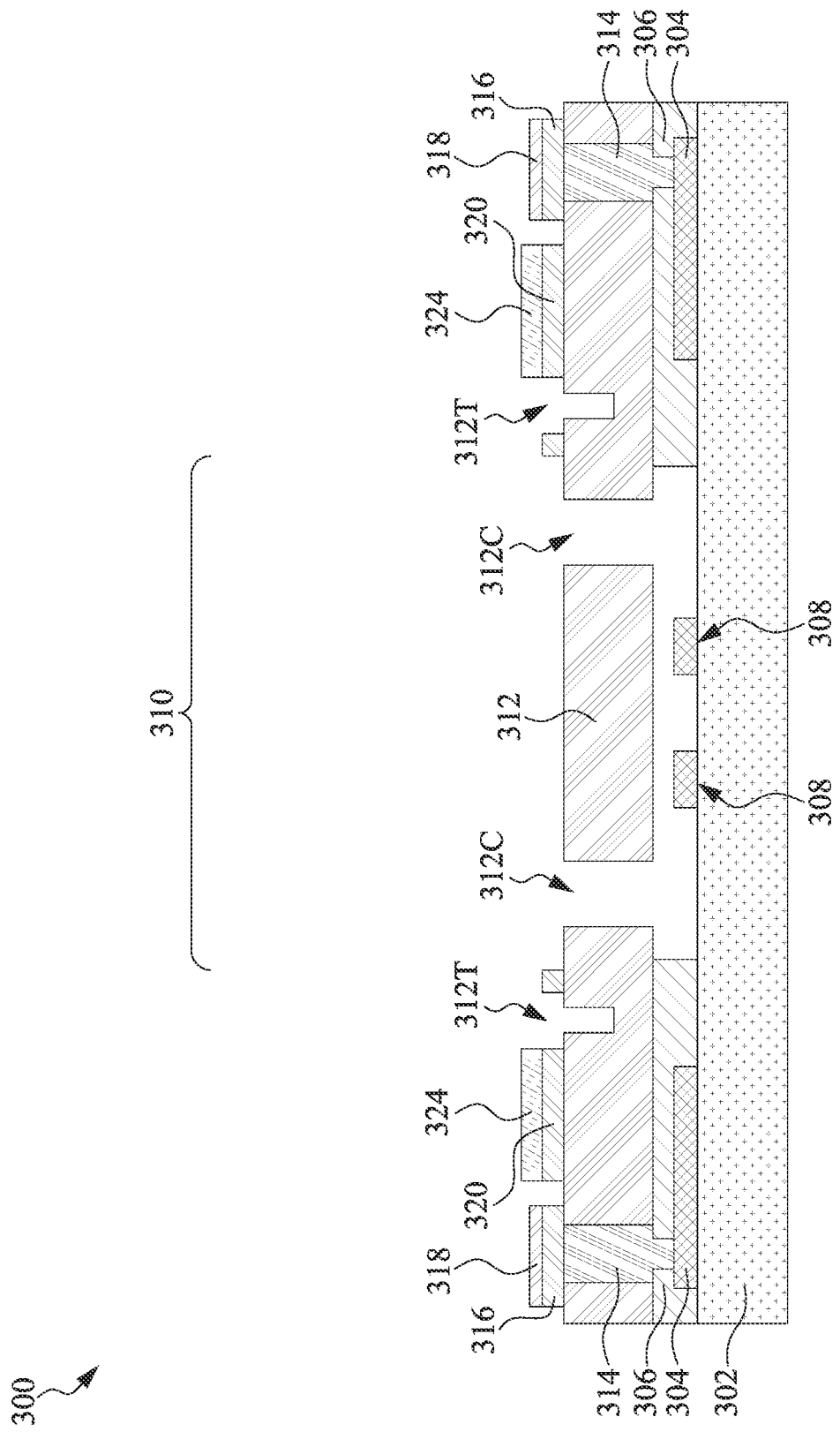

Referring to FIG. 3F, the substrate 312 is patterned to form one or more openings or recesses 312C by various operations, e.g., etching and lithography operations. The openings 312C is in communication with the cavity 310 formed between the substrate 312 and the substrate 302. In embodiments where the semiconductor device 300 is a MEMS device, e.g., a pressure sensor device, a motion sensor device, an accelerometer device, a gyroscope device, a membrane microphone device, or the like, the substrate 312 is patterned to form a flexible membrane over the cavity 310. The stopper structure 308 may be utilized to prevent stiction of the membrane on the substrate 302 when the membrane bends toward the substrate 302.

In some embodiments, trenches 312T are formed from the upper surface of the substrate 312 adjacent to the bonding layer 320. During eutectic bonding, the bonding material can be pressed and squeeze (squish) out of the bonding interface, causing contamination or even failure of the semiconductor device 300. The trenches 312T are configured to address the squishing issue. The depth and width of the trenches 312T are configured to effectively contain the squeezed bonding materials to thereby prevent an overflow of such materials to unintended locations of the substrate 312. Thus, the performance of the eutectic bonding can be improved.

Figure 4A:
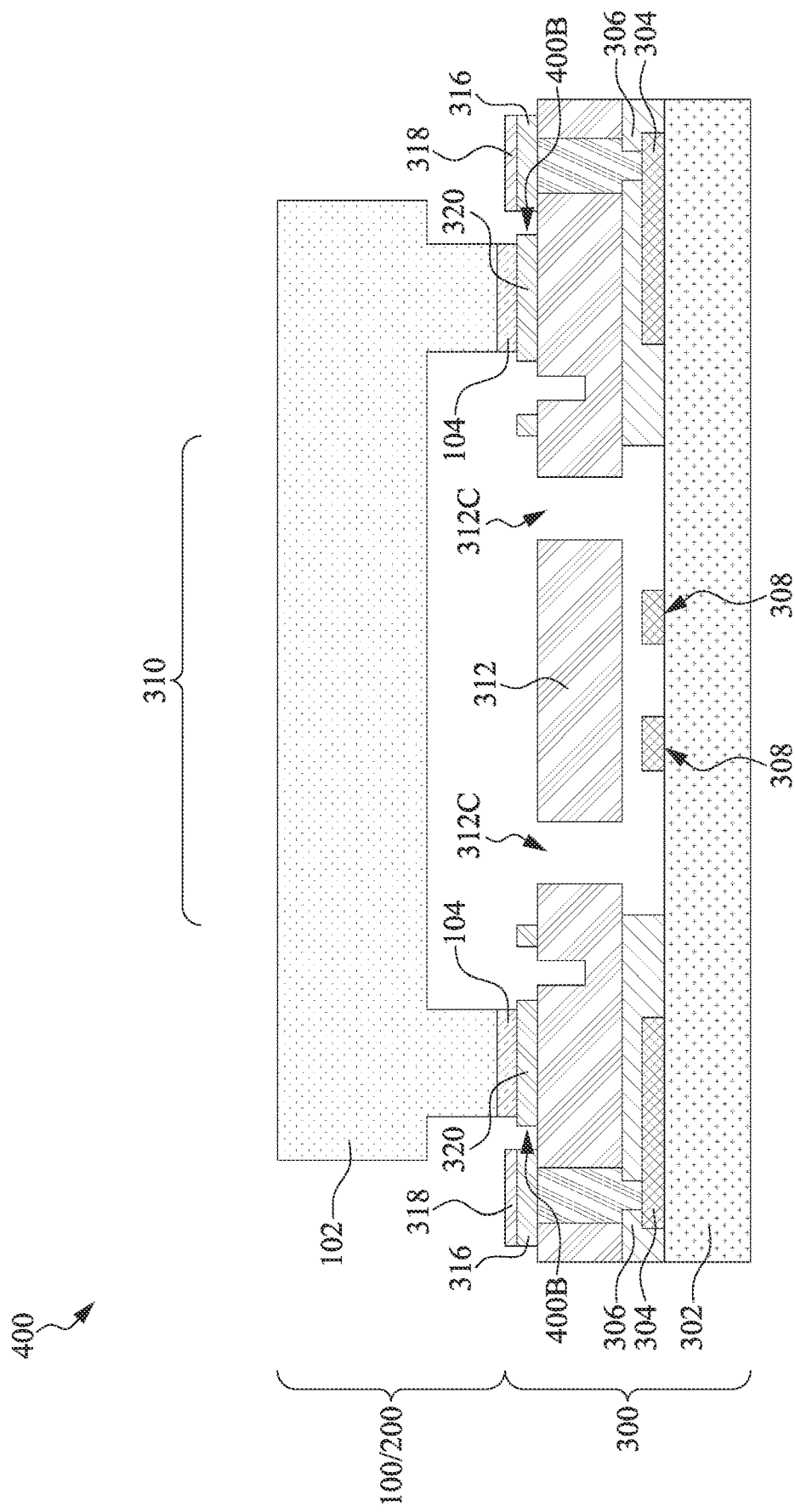
FIG. 4A is a cross-sectional view of a semiconductor device, in accordance with some embodiments.

FIG. 4A is a cross-sectional view of a semiconductor device 400, in accordance with some embodiments. The semiconductor device 400 may be a 3DIC device, a MEMS device, a semiconductor package device, or the like. In some embodiments, the semiconductor device 400 is formed by bonding the cap structure 100 or 200 shown in FIG. 1G or FIG. 2H, respectively, with the semiconductor device 300 through bonding the bonding layer 104 (or 204) of the cap structure 100 (or 200) with the bonding layer 320 of the semiconductor device 300.

In some embodiments, the semiconductor device 300 is transported to a bonding tool, and the substrate 302 may be held on a stage in the bonding tool. The cap structure 100 is also transported to the bonding tool, in which the substrate 102 is held by a carrier over the stage. Initially, the substrate 102 is moved to align with the substrate 302, e.g., using an alignment operation. Through the alignment operation, the bonding layer 104 (or, alternatively, bonding layers 204 and 254) of the respective cap structure 100 (or 200) in the substrate 102 is aligned with a corresponding bonding layer 320 on the substrate 302. In some embodiments, a bonding force is exerted on the carrier to thereby cause the substrate 102 to move downward and engage with the substrate 302. The bonding layer 104 is bonded to the bonding layer 320 by the bonding force of the bonding tool. As a result, the cavity 310 is sealed and defined by the substrate 302, the substrate 312, and the bonding layer 320 together with the substrate 102 and the bonding layers 104 (or 204, 254) of the cap structure 100 (or 200).

The bonding operation forms a eutectic bond at an interface 400B between the bonding layer 104 (or 204, 254) and the bonding layer 320. A eutectic alloy (not shown in FIG. 4A, but illustrated as feature 326 in FIG. 4E), e.g., an aluminum-germanium alloy, is formed at the interface 400B. The eutectic bond is formed under suitable bonding conditions, such as a controlled bonding temperature and a controlled bonding pressure. In some embodiments, the processing temperature for eutectic bonding is in a range between about 150° C. and about 500° C., or between about 200° C. and about 430° C., to facilitate reaction, e.g., inter-diffusion, of the atoms in the bonding layers 104 and 320 to form the eutectic alloy 326 as the eutectic bond.

As discussed previously, before the bonding operation shown in FIG. 4A is performed, an oxide layer 324 may be formed on the surface of the bonding layer 320 once the bonding layer 320 is exposed to air. Such oxide layer 324 may interfere with the atom diffusion during the formation of the eutectic bond 326. As a result, the presence of the oxide layer 324 at the interface 400B between the bonding layer 104 and the bonding layer 320 will prevent the eutectic bond 326 from being formed with desirable performance.

After the bonding of the substrate 102 with the substrate 302 is completed, a thinning operation may be performed on the substrate 102 to separate the individual cap structures 100 (or 200) by the trenches 112 (shown in FIG. 1E or 2F). In some embodiments, a singulation or dicing operation is performed to separate the bonded structure of FIG. 4A into individual semiconductor devices 400.

In some embodiments, the bonding force provided by the bonding tool is in a range between about 20 kN and about 100 kN, or between about 35 kN and about 45 kN. In a common situation, a greater bonding force will provide a greater bonding pressure to the bonding materials. The increased bonding pressure aids in enhancing the performance of eutectic bonding not only by providing a diffusion-friendly processing pressure for bonding, but also by squeezing out the oxide layer 324 from the bonding interface 400B or penetrating the oxide layer 324 during bonding. However, due to practical limitations, the bonding tool may not be able to increase the bonding pressure by exerting greater bonding force for some bonding applications. Furthermore, increasing the bonding force alone without improving the robustness of the bonded semiconductor device 400 may run the risk of damaging other features of the bonded semiconductor device 400.

Figure 4B:
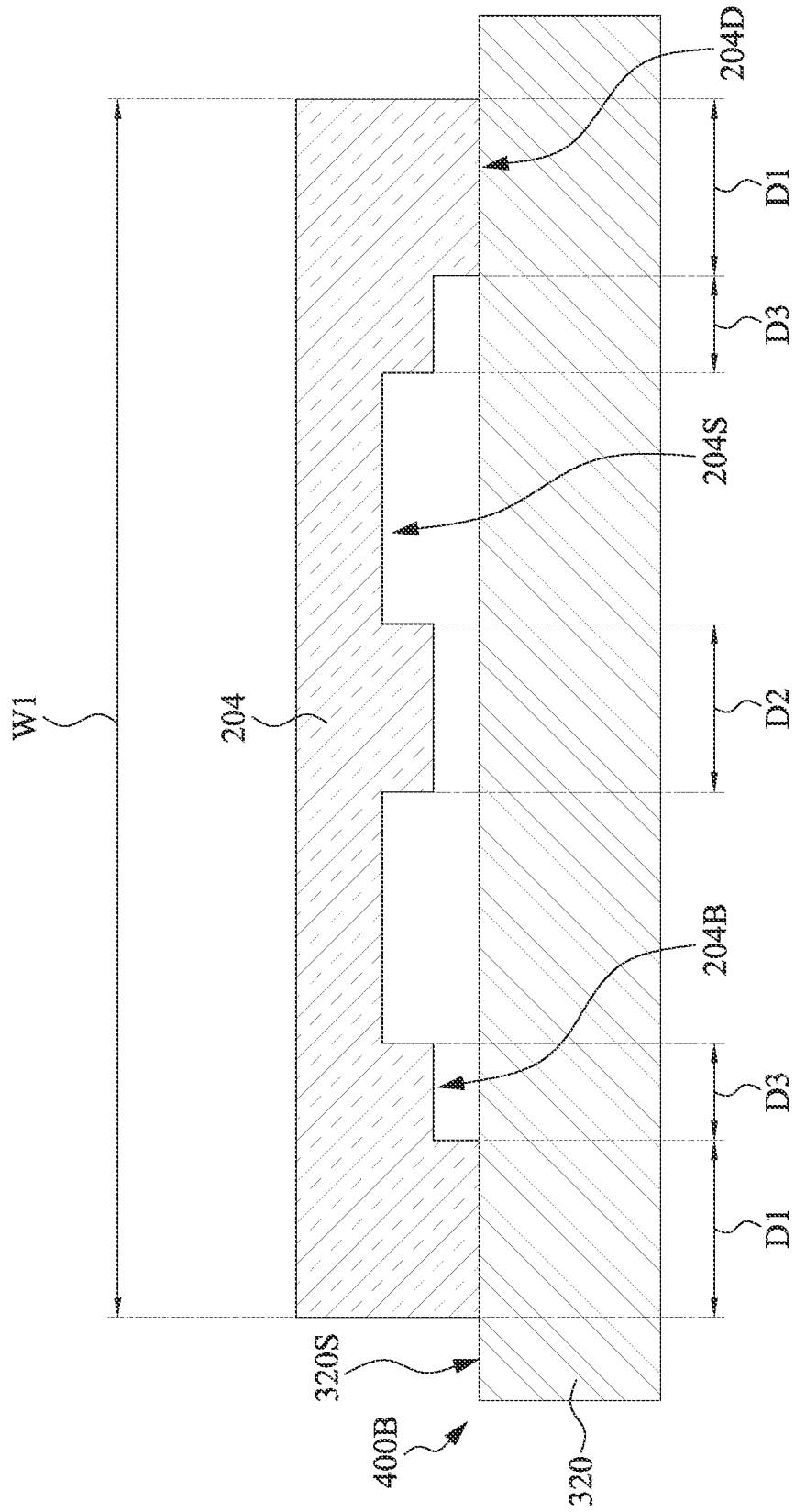
Figure 4C:
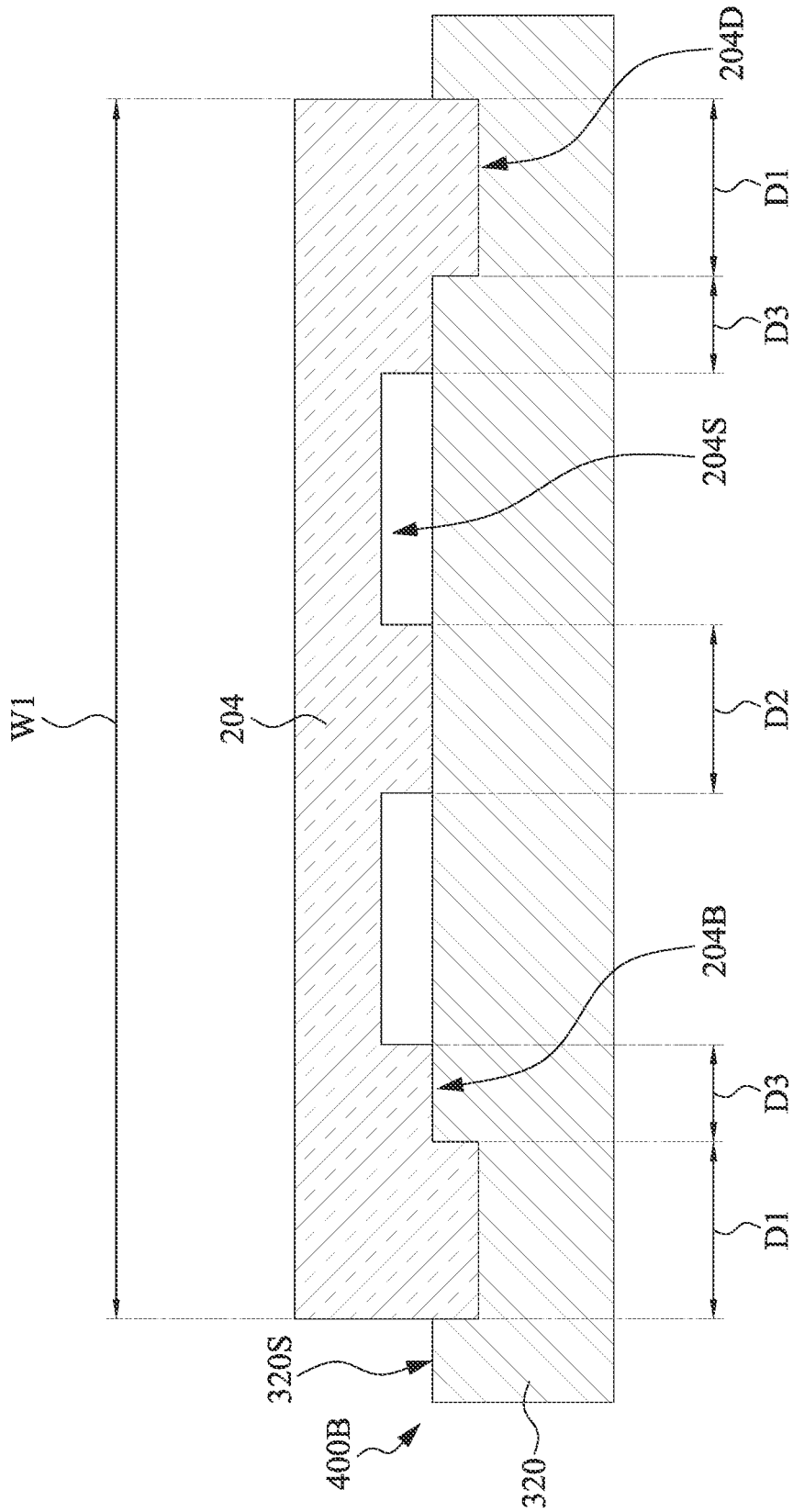

FIGS. 4B to 4D are cross-sectional views of different bonding stages of forming the semiconductor device 400, in accordance with some embodiments. The embodiment shown in FIGS. 4B to 4D is illustrated by taking the bonding layer 204 as an example. However, the bonding layer 204 can be replaced by the bonding layers 104 and 254. Due to the arrangement of a stepped profile of the surface on the bonding layer 204, the bonding pressure at the interface 400B between the bonding layers 204 and 320 may be different at different bonding stages even under the same bonding force. For example, as shown in FIG. 4B, when the bonding layer 204 is moved down to be initially engaged with the bonding layer 320, the bonding layer 204 contacts the bonding layer 320 at the surfaces 204D. A bonding pressure X1 experienced at the surfaces 204D of the bonding layer 204 across the widths 2×D1 is thus greater than a bonding pressure X3 experienced by an existing bonding layer with a planar surface across the entire first width W1. The increased bonding pressure X1 may aid in squeezing out the oxide layer 324 from the interface 400B, and thus a better eutectic alloy 326 is formed at the surfaces 204D (not shown in FIG. 4B to FIG. 4D, but illustrated in FIG. 4E).

As discussed previously, the width ratio R1 between the second width D1 and the first width W1 is between about 10% and about 50%. If the width ratio R1 is less than about 10%, the protrusions P1 may not provide a sufficient area of improved eutectic bond 326 at the interface 400B. If the width ratio R1 is greater than about 50%, the bonding pressure X1 exerted on the protrusions P1 may not be sufficient to break the oxide layer 324.

Referring to FIG. 4C, when the bonding layer 204 is continuously pressed downward toward the bonding layer 320, the bonding layer 204 contacts the bonding layer 320 at the surfaces 204B in addition to the surfaces 204D. During the bonding stage of FIG. 4C, the protrusions 204P with the surfaces 204D are pressed to penetrate into the bonding layer 320. The bonding pressure experienced at the surfaces 204B and 204D across the widths 2×D1+D2+2×D3 is thus still greater than the pressure X3 experienced by an existing bonding layer with a planar surface across the entire first width W1, but less than the pressure X1 as shown in FIG. 4B. The bonding pressure X2 may also aid in squeezing out the oxide layer 324 from the interface between the bonding layers 204 and 320, to thereby provide a better eutectic alloy 326 with a greater width from a cross-sectional view than that is formed with the pressure X1 alone.

Referring to FIG. 4D, when the bonding layer 204 is further pressed downward toward the bonding layer 320, the bonding layer 204 fully contacts the bonding layer 320 at the surfaces 204S, 204B and 204D. During the bonding stage of FIG. 4D, the protrusions 204P and 204Q with the surfaces 204D and 204B are pressed to penetrate into the bonding layer 320. The bonding pressure X3 experienced across the surfaces 204S, 204B and 204D is thus substantially equal to the pressure X3 experienced by an existing bonding layer with a planar surface across the entire first width W1. The bonding pressure X3 can aid in formation of the eutectic bond 326 at the interface 400B with a greater width from a cross-sectional view than that is formed with the pressure X1 or X2 alone. As a result, the eutectic bond 326 is formed at the interface 400B. The cavity 310 formed by bonding the bonding layers 204 and 320 with the eutectic bond 326 has better hermitic performance accordingly.

Figure 4E:
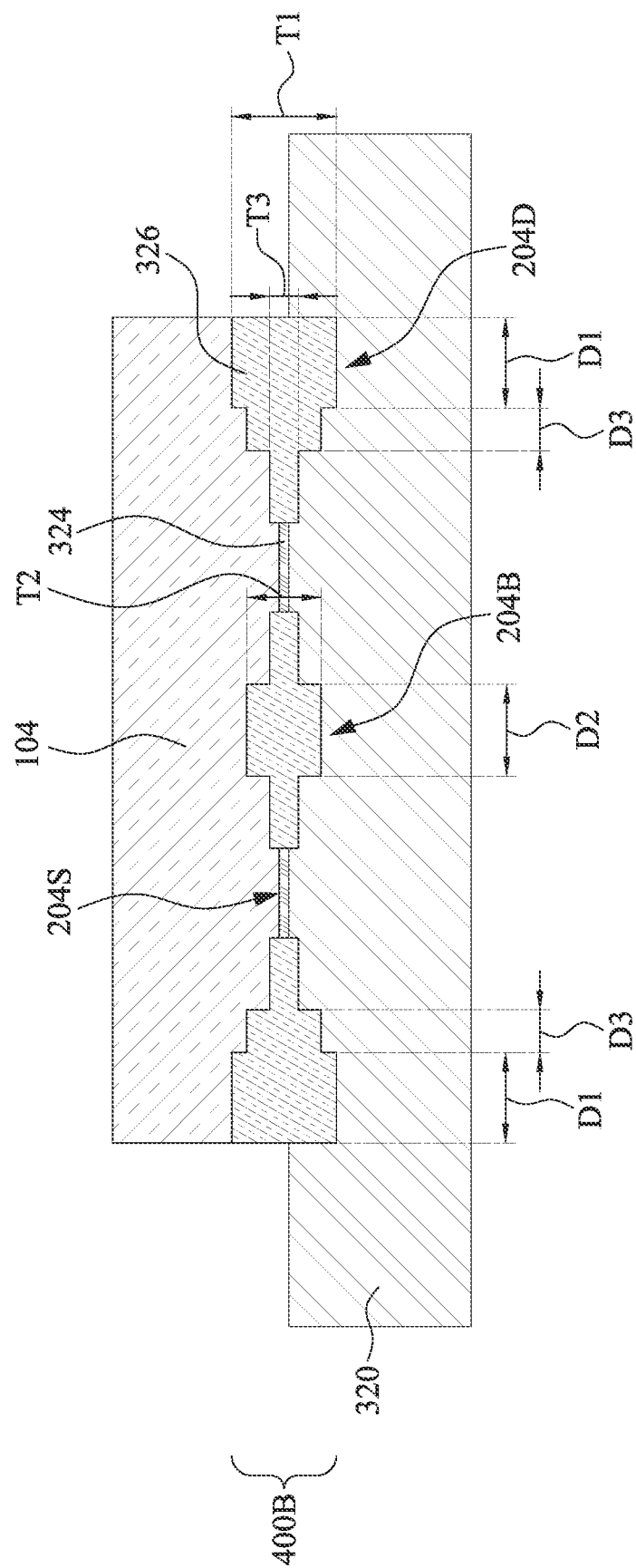
FIG. 4E is a cross-sectional view of a bonding interface of a semiconductor device, in accordance with some embodiments.

FIG. 4E is a cross-sectional view of the bonding interface 400B between the bonding layers 204 and 320 in the semiconductor device 400, in accordance with some embodiments. The eutectic bond 326 is formed at the interface 400B. As discussed previously, the bonding performance of the eutectic bond 326 is influenced by the bonding pressure X1, X2 or X3 exerted on the surfaces at which the bonding layer 204 contact the bonding layer 320. Since the bonding pressures X1, X2 and X3 are made progressively less during the bonding operation, the amount (or equivalently, concentration or thickness) of the eutectic alloy 326 formed at different locations of the interface 400B may vary according to their corresponding instant bonding pressures. As a result, the eutectic alloy 326 may exhibit a substantially stepped shape at the interface 400B. In some embodiments, the number of steps of the eutectic alloy 326 is determined by the number of the steps of the bonding layer 204, or equivalently, the number of different bonding pressures exerted to the bonding layers 204 and 320 during the bonding operation. Referring to FIG. 2I and FIG. 4E, the eutectic alloy 326 has a first eutectic alloy thickness T1 at the first protrusions 204P (or equivalently the surface 204D with the second width D1), a second eutectic alloy thickness T2 at the second protrusion 204Q (or equivalently the surface 204B with the third width D2+2×D3), and a third eutectic alloy thickness T3 at the planar surface 204S. In some embodiments, the eutectic alloy thicknesses T1, T2 and T3 are different from each other. In some embodiments, the first eutectic alloy thickness T1 is in a range between about 100 nm and about 5 μm. In some embodiments, the second eutectic alloy thickness T2 is in a range between about 100 nm and about 500 nm. In some embodiments, the third eutectic alloy thickness T3 is in a range between about 10 nm and about 100 nm. In some embodiments, the first eutectic alloy thickness is greater than the eutectic alloy second thickness and the third eutectic alloy thickness. In some embodiments, the second eutectic alloy thickness is greater than the third eutectic alloy thickness.

In some embodiments, a portion of the oxide layer 324 is present at the location corresponding to the surface 204S of the interface 400B due to that the bonding pressure X3 is insufficient to remove the oxide layer 324 from the interface 400B. In some embodiments, the eutectic alloy 326 is a contiguous layer across the area aligned with the first protrusions 204P and the second protrusion 204Q. In some embodiments, the eutectic alloy 326 is non-contiguous across the area corresponding to the planar surface 204S. In some embodiments, a portion of the oxide layer 324 is formed in the eutectic bond 326 between the bonding layers 204 and 320.

Referring to FIG. 2I, FIG. 4A and FIG. 4E, the oxide layer 324 has a first oxide thickness (or concentration) at the first protrusions 204P (or equivalently the surface 204D), a second oxide thickness (or concentration) at the second protrusion 204Q (or equivalently the surface 204B), and an oxide third thickness (or concentration) at the planar surface 204S. In some embodiments, the first oxide thickness (or concentration) is substantially equal to or less than the second oxide thickness (or concentration) and the third oxide thickness (or concentration). In some embodiments, the second oxide thickness (or concentration) is substantially equal to or less than the third oxide thickness (or concentration).

Figure 5A:
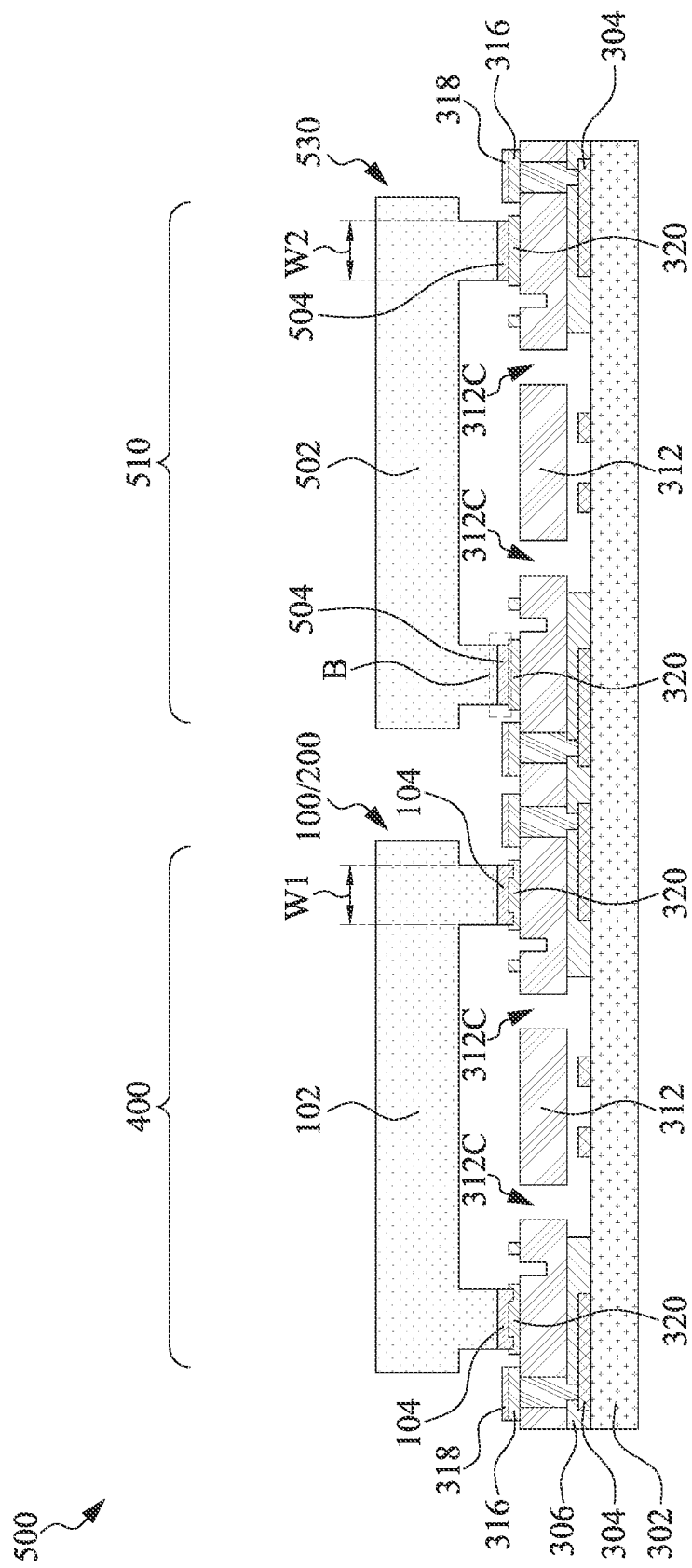
FIG. 5A is a cross-sectional view of a semiconductor device, in accordance with some embodiments.

FIG. 5A is a cross-sectional view of a semiconductor device 500, in accordance with some embodiments. The semiconductor device 500 includes the semiconductor device 400 and a semiconductor device 510. The semiconductor device 400 and the semiconductor device 510 may be formed on a same substrate, e.g., the substrate 302. Alternatively, the semiconductor device 400 and the semiconductor device 510 may be formed in a stack. The semiconductor device 510 is similar to the semiconductor device 400 in many aspects, and thus these similar aspects are not repeated for brevity. The semiconductor device 510 is different from the semiconductor device 400 in that the semiconductor device 510 includes a cap structure 530, in which the cap structure 530 includes a substrate 502 and a bonding layer 504. In some embodiments, the substrate 502 is similar to the substrate 102, 302 or 312.

Figure 5B:
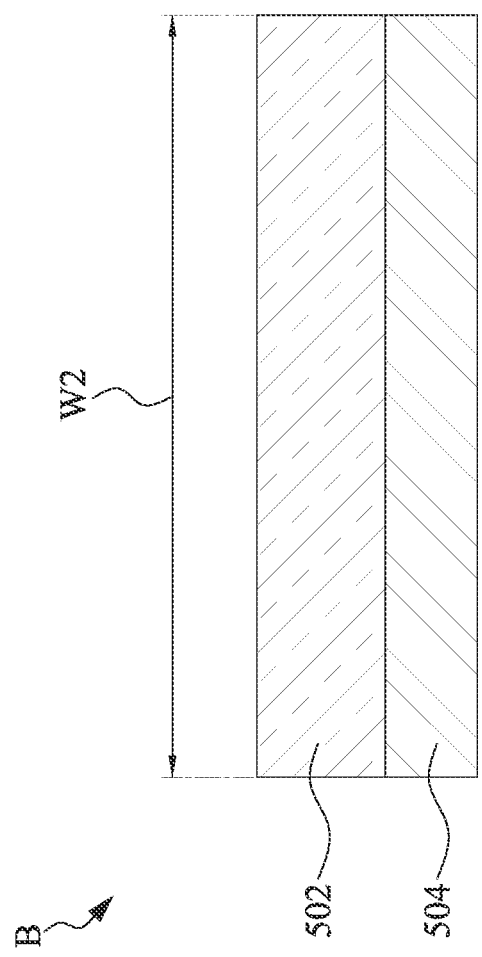
FIG. 5B is an enlarged view of a cross-sectional view of a bonding layer shown in FIG. 5A, in accordance with some embodiments.

FIG. 5B is an enlarged view of a cross-sectional view of the bonding layer 504 shown in FIG. 5A, in accordance with some embodiments. As shown in FIG. 5B, an entirety of the upper surface 504S of the bonding layer 504 includes a substantially planar or flat surface with a width W2 from a cross-sectional view. Referring to FIGS. 5A and 5B, the width W2 is less than the width W1 of the bonding layer 104, 204 or 254 of the cap structure 100 or 200. In some embodiments, the width W2 is in a range between about 15 nm and about 80 nm, or between about 20 nm and about 50 nm, such as 30 nm. In some embodiments, a ratio of the width W2 to the width W1 is in a range between about 40% and about 80%, or between about 50% and about 80%. Through the reduction of the width W2 of the bonding layer 504, the bonding pressure X4 exerted upon the bonding layer 504 can be effectively greater than the pressure X3 experienced in an existing bonding layer with a whole planar surface of the first width W1. As a result, the bonding layer 504 with a reduced planar surface can provide a eutectic bond comparable to that provided by the bonding layer 104, 204 or 254, which include a stepped profile of the bonding surface.

Figure 6:
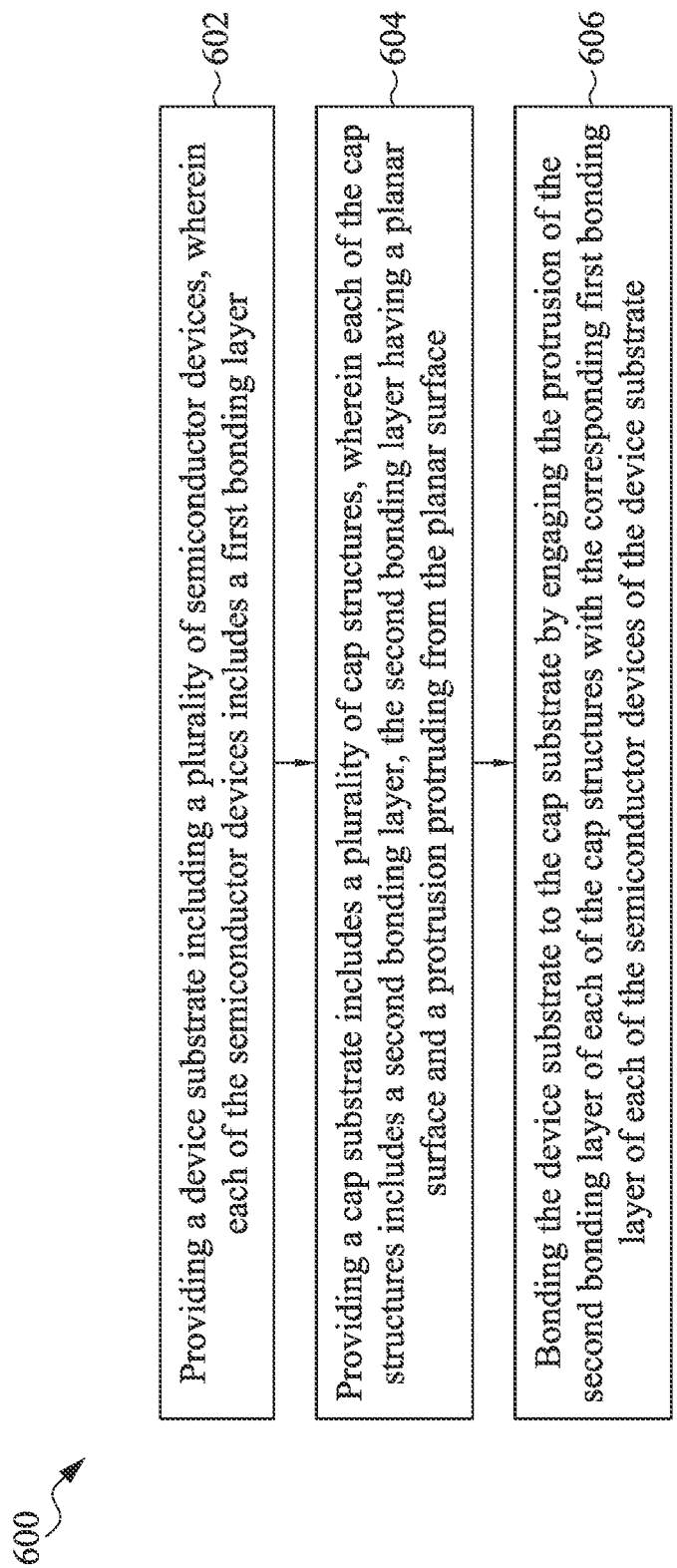
FIG. 6 shows a flowchart of a bonding method, in accordance with some embodiments.

FIG. 6 shows a flowchart of a bonding method 600, in accordance with some embodiments. It shall be understood that additional steps can be provided before, during, and after the steps shown in FIG. 6, and some of the steps described below can be replaced or eliminated, for additional embodiments of the method 600. The order of the steps may be interchangeable. Some of the steps may be performed concurrently or independently.

At step 602, a device substrate is provided including a plurality of semiconductor devices, wherein each of the semiconductor devices includes a first bonding layer.

At step 604, a cap substrate is provided includes a plurality of cap structures, wherein each of the cap structures includes a second bonding layer, the second bonding layer having a planar surface and a protrusion protruding from the planar surface. In some embodiments, the order of steps 602 and 604 can be interchanged, or the steps 602 and 604 can be performed at the same time.

At step 606, the device substrate is bonded to the cap substrate by engaging the protrusion of the second bonding layer of each of the cap structures with the corresponding first bonding layer of each of the semiconductor devices of the device substrate.

Some embodiments of the present disclosure provide a method. A device substrate is provided including a plurality of semiconductor devices, wherein each of the semiconductor devices includes a first bonding layer. A cap substrate is provided including a plurality of cap structures, wherein each of the cap structures includes a second bonding layer, the second bonding layer having a planar surface and a first protrusion protruding from the planar surface. The device substrate is bonded to the cap substrate by engaging the first protrusion of the second bonding layer of each of the cap structures with the corresponding first bonding layer of each of the semiconductor devices in the device substrate.

Some embodiments of the present disclosure provide a method. A semiconductor device is formed in a first substrate, wherein the semiconductor device includes a first bonding layer including a first planar surface. A cap structure is formed in a second substrate, wherein the cap structure includes a second bonding layer, and the second bonding layer includes a second planar surface and a first protrusion protruding from the second planar surface. The semiconductor device is bonded to the second substrate by engaging the first planar surface with the second planar surface such that the first protrusion penetrates into the first bonding layer.

Some embodiments of the present disclosure provide a semiconductor structure. The semiconductor structure includes a semiconductor device having a first bonding layer defining a cavity, and a cap structure bonded to the semiconductor device. The cap structure includes a second bonding layer bonded to the first bonding layer and defining the cavity, wherein the second bonding layer includes a surface and a protrusion protruding from the surface. The semiconductor structure further includes a eutectic bond between the first bonding layer and the second bonding layer, wherein the eutectic bond has a first thickness at the protrusion greater than a second thickness at the surface.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a device substrate comprising a plurality of semiconductor devices, wherein each of the semiconductor devices comprises a first bonding layer;
providing a cap substrate comprising a plurality of cap structures, wherein each of the cap structures comprises a second bonding layer, the second bonding layer having a planar surface and a first protrusion protruding from the planar surface, wherein the first protrusion has an outer sidewall flushed with an outer sidewall of the second bonding layer and an inner sidewall having a stepped profile; and
bonding the device substrate to the cap substrate by engaging the first protrusion of the second bonding layer of each of the cap structures with the corresponding first bonding layer of each of the semiconductor devices in the device substrate.

2. The method of claim 1, wherein the bonding of the device substrate to the cap substrate comprises forming a cavity between each of the cap structures and the corresponding semiconductor devices.

3. The method of claim 1, wherein the second bonding layer further comprises a second protrusion adjacent to the first protrusion and protruding from the planar surface.

4. The method of claim 3, wherein the first protrusion has a first height greater than a second height of the second protrusion.

5. The method of claim 1, wherein the providing of the device substrate comprises causing an oxide layer to be formed on the first bonding layer.

6. The method of claim 5, wherein the bonding of the device substrate to the cap substrate comprises causing the first protrusion to penetrate through the oxide layer and bond to the first bonding layer.

7. The method of claim 5, wherein through the bonding the oxide layer has a first thickness at the first protrusion and a second thickness, greater than the first thickness, at the planar surface.

8. The method of claim 1, wherein the engaging of the first protrusion with the first bonding layer comprises performing eutectic bonding to form a eutectic bond between the first protrusion and the first bonding layer.

9. The method of claim 8, wherein the eutectic bond has a first thickness at the planar surface less than a second thickness at the first protrusion.

10. The method of claim 1, wherein the first protrusion includes a ring shape from a top-view perspective.

11. A method, comprising:
forming a semiconductor device in a first substrate, wherein the semiconductor device comprises a first bonding layer including a first planar surface;
forming a cap structure in a second substrate, wherein the cap structure comprises a second bonding layer, and the second bonding layer includes a second planar surface and a first protrusion protruding from the second planar surface, wherein the first protrusion has an outer sidewall flushed with an outer sidewall of the second bonding layer and an inner sidewall having a stepped profile; and
bonding the semiconductor device to the second substrate by engaging the first planar surface with the second planar surface such that the first protrusion penetrates into the first bonding layer.

12. The method of claim 11, wherein the forming of the semiconductor device comprises forming an oxide layer on the first bonding layer, wherein the bonding of the semiconductor device to the second substrate comprises causing the first protrusion to penetrate through the oxide layer and bond to the first bonding layer.

13. The method of claim 11, wherein the forming of the semiconductor device comprises forming an oxide layer on the first bonding layer, wherein the bonding of the semiconductor device to the second substrate comprises causing the second bonding layer to bond to the first bonding layer with the oxide layer therebetween.

14. The method of claim 11, wherein the second bonding layer further includes a second protrusion adjacent to the first protrusion and protruding from the second planar surface, wherein the first protrusion and the second protrusion form concentric rings.

15. The method of claim 14, wherein the engaging of the first planar surface with the second planar surface forms a eutectic bond between the first bonding layer and the second bonding layer, wherein the eutectic bond includes different thicknesses at the first protrusion, the second protrusion and the second planar surface.

16. The method of claim 15, wherein the eutectic bond is non-contiguous across the second planar surface.

17. The method of claim 11, wherein the first protrusion includes tapered sidewalls.

18. A method, comprising:
providing a cap substrate comprising a first cap structure and a second cap structure, wherein the first cap structure comprises a first bonding layer having a first planar surface, the second cap structure comprises a second bonding layer having a second planar surface and a first protrusion protruding from the second planar surface;
providing a device substrate comprising a plurality of semiconductor devices, wherein each of the semiconductor devices comprises a third bonding layer having a third planar surface; and bonding the device substrate to the cap substrate by engaging the first planar surface with one of the third planar surfaces and engaging the second planar surface with another third planar surface.

19. The method of claim 18, wherein the first bonding layer has a first width less than a second width of the second bonding layer.

20. The method of claim 18, wherein the device substrate further comprising a trench adjacent to the third bonding layer and configured to contain squeezed bonding materials generated during the bonding of the device substrate to the cap substrate.

\* \* \* \* \*